(12) United States Patent
Toyoda

(10) Patent No.: US 11,581,395 B2
(45) Date of Patent: Feb. 14, 2023

(54) DISPLAY DEVICE AND ELECTRONIC DEVICE

(71) Applicant: Sony Semiconductor Solutions Corporation, Kanagawa (JP)

(72) Inventor: Takashi Toyoda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/046,344

(22) PCT Filed: Apr. 5, 2019

(86) PCT No.: PCT/JP2019/015139
§ 371 (c)(1),
(2) Date: Oct. 9, 2020

(87) PCT Pub. No.: WO2019/203027
PCT Pub. Date: Oct. 24, 2019

(65) Prior Publication Data
US 2021/0110766 A1    Apr. 15, 2021

(30) Foreign Application Priority Data

Apr. 17, 2018   (JP) .............................. JP2018-078842

(51) Int. Cl.
*G09G 3/3225*     (2016.01)
*H01L 27/32*      (2006.01)

(52) U.S. Cl.
CPC ....... *H01L 27/3279* (2013.01); *G09G 3/3225* (2013.01); *H01L 27/3276* (2013.01); *G09G 2330/08* (2013.01)

(58) Field of Classification Search
CPC ...... G09G 3/3233; G09G 3/3225; G09G 3/20; H01L 27/32; H01L 27/3276; H01L 27/3279; H05B 33/08
See application file for complete search history.

(56) References Cited

U.S. PATENT DOCUMENTS

| 9,748,318 | B2 * | 8/2017 | Shim ................... H01L 27/3258 |
| 2006/0158095 | A1 * | 7/2006 | Imamura ............. H01L 51/5212 |
| | | | 313/500 |
| 2009/0262258 | A1 * | 10/2009 | Taneda ................. G09G 3/3225 |
| | | | 348/739 |

(Continued)

FOREIGN PATENT DOCUMENTS

CN   101599534 A   12/2009
CN   107579102 A   1/2018

(Continued)

*Primary Examiner* — Sardis F Azongha
(74) *Attorney, Agent, or Firm* — Michael Best & Friedrich LLP

(57) ABSTRACT

A display device and electronic device are disclosed. In one example, a display device includes a pixel array portion including pixels arrayed in a matrix having a row direction and a column direction. The pixels each respectively including a light emission unit. A fixed potential line surrounds the pixel array portion in a frame portion outside the pixel array portion, and a pixel portion auxiliary cable is arranged to extend across the pixel array portion. The pixel portion auxiliary cable is interlayer connected to the fixed potential line at a location in the frame portion outside the pixel array portion.

26 Claims, 14 Drawing Sheets

(56) References Cited

U.S. PATENT DOCUMENTS

2018/0019294 A1   1/2018   Zhai

FOREIGN PATENT DOCUMENTS

| | | |
|---|---|---|
| JP | 2004361585 A | 12/2004 |
| JP | 2005149800 A | 6/2005 |
| JP | 2006201421 A | 8/2006 |
| JP | 2007147814 A | 6/2007 |
| JP | 2007273261 A | 10/2007 |
| JP | 2009109519 A | 5/2009 |
| JP | 2009175389 A | 8/2009 |
| JP | 2009271188 A | 11/2009 |
| JP | 2010145661 A | 7/2010 |
| JP | 2012142315 A | 7/2012 |
| JP | 2012-209018 A | 10/2012 |
| JP | 2013118074 A | 6/2013 |
| KR | 20050105049 A | 11/2005 |
| TW | 200725956 A | 7/2007 |
| WO | WO-2009055920 A1 | 5/2009 |
| WO | WO-2009122998 A1 | 10/2009 |
| WO | WO-2013069234 A1 | 5/2013 |

\* cited by examiner

DISPLAY DEVICE AND ELECTRONIC DEVICE

TECHNICAL FIELD

The present disclosure relates to a display device and an electronic device.

BACKGROUND ART

As an index of performance of a display device, pixel resolution, luminance, a size of a frame portion, and the like can be used. Then, a display device having high pixel resolution, high luminance, and a narrow frame can be said to be a high-performance display device.

Meanwhile, as one of flat panel type display devices regarded as mainstream in recent years, there can be given an organic EL display device that uses electro luminescence (EL) of organic material, and uses, as a light emission unit, an organic EL element that uses a phenomenon in which light is emitted by applying an electric field to an organic thin film (for example, refer to Patent Document 1).

CITATION LIST

Patent Document

Patent Document 1: Japanese Patent Application Laid-Open No. 2012-209018

SUMMARY OF THE INVENTION

Problems to be Solved by the Invention

For achieving higher luminance in an organic EL display device, it is only required that an amount of current flowed in the organic EL element is increased. For increasing the current amount, a cathode cable connected a cathode electrode of the organic EL element needs to have a capacity to flow current increasing in amount. The cathode cable is formed in a frame portion being a peripheral region of a pixel array portion.

Because an electrical cable laid out in the frame portion is also used as an electrical cable of a peripheral circuit portion, depending on a circuit configuration of the peripheral circuit portion, in some cases, the cathode cable cannot have a sufficient capacity to flow current increasing in amount. For example, in a display device having high pixel resolution, because a wiring region of the frame portion is decreased by an increase in circuit configuration of the peripheral circuit portion that is caused in accordance with an increase in the number of pixels, and it becomes impossible to widely lay out the cathode cable, interconnection resistance of the cathode cable increases in some cases.

The same applies to a display device aiming to have a narrower frame. Due to a narrower frame, a wiring region of the frame portion cannot be sufficiently secured, and interconnection resistance of the cathode cable cannot be sufficiently decreased in some cases. Then, because current flowing in the cathode cable is restricted due to higher resistance of the cathode cable, this becomes an obstructive factor of higher luminance.

As obviously seen from the above description, for promoting higher performance of a display device such as an organic EL display device, in the current situation, it is difficult to satisfy all of enhancement of pixel resolution, higher luminance, and a narrower frame.

In view of the foregoing, the present disclosure aims to provide a display device that can simultaneously satisfy higher luminance and a narrower frame in achieving higher performance, and an electronic device including the display device.

Solutions to Problems

A display device of the present disclosure for achieving the above-described purpose includes a pixel array portion including arrayed pixels including a light emission unit, and a fixed potential line provided around the pixel array portion, in which a pixel portion auxiliary cable electrically connected to the fixed potential line is provided in the pixel array portion.

Furthermore, an electronic device of the present disclosure for achieving the above-described purpose includes a display device having the above-described configuration.

MODE FOR CARRYING OUT THE INVENTION

Figure 1:
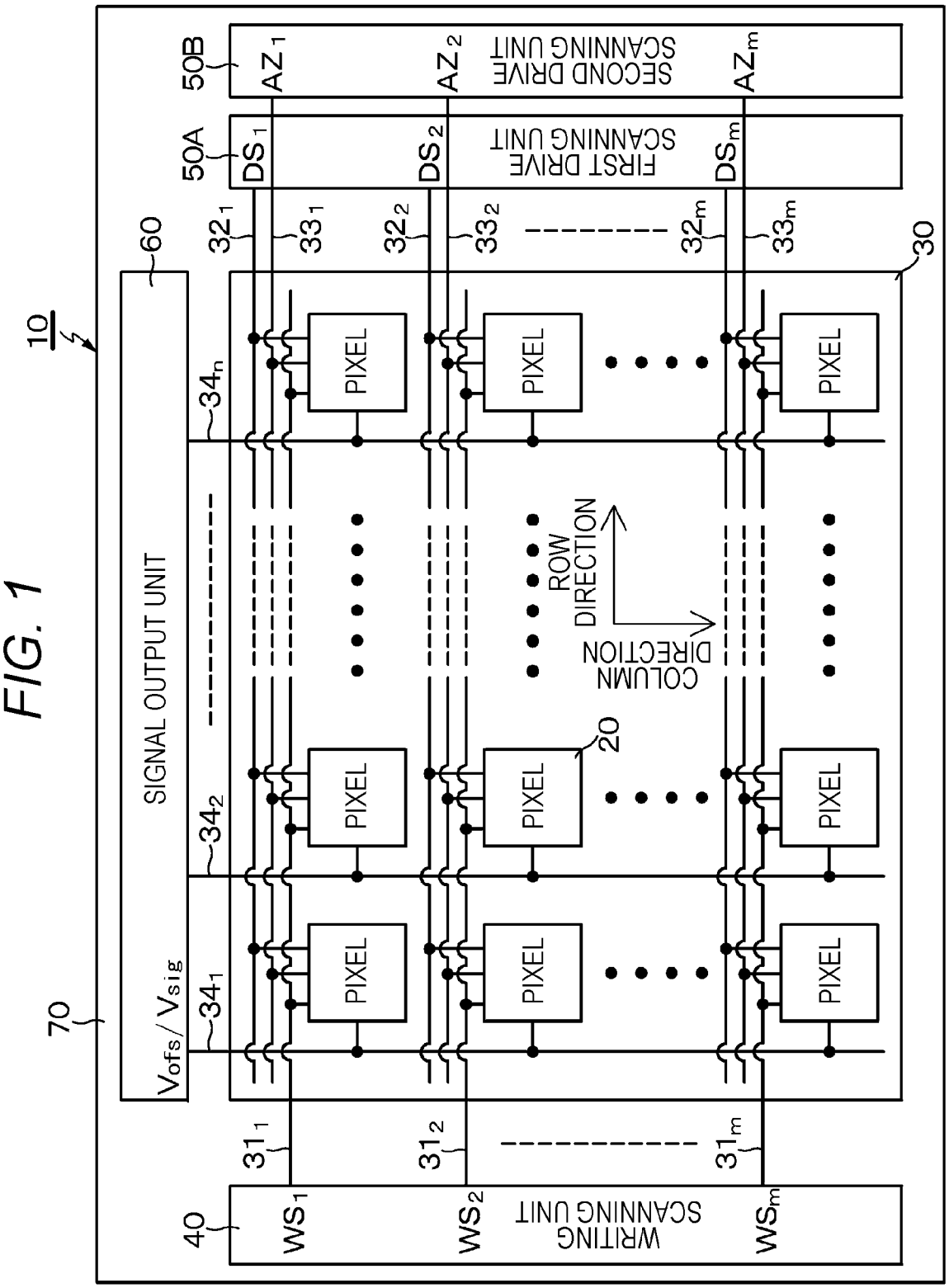
FIG. 1 is a system configuration diagram schematically illustrating a configuration of an organic EL display device to which the technology of the present disclosure is applied.

Hereinafter, a mode for carrying out the technology of the present disclosure (hereinafter, will be described as an "embodiment") will be described using the drawings. The technology of the present disclosure is not limited to an embodiment, and various numerical values, materials, and the like in the embodiment are exemplifications. In the following description, the same components or components having the same function are assigned the same reference numerals, and the redundant description will be omitted. Note that the description will be given in the following order.

1. General Description about Display Device and Electronic Device According to Present Disclosure
2. Display Device to Which Technology of Present Disclosure Is Applied
2-1. System Configuration
2-2. Pixel Circuit
2-3. Conventional Panel Wiring Structure
3. Embodiment of Present Disclosure
3-1. Pixel Circuit According to Embodiment
3-2. First Embodiment (Example of Using Semiconductor Substrate as Substrate of Display Panel)
3-3. Second Embodiment (First Example of Cross-Sectional Structure of Panel Wiring Structure)
3-4. Third Embodiment (Second Example of Cross-Sectional Structure of Panel Wiring Structure)
3-5. Fourth Embodiment (Third Example of Cross-Sectional Structure of Panel Wiring Structure)
3-6. Fifth Embodiment (Modified Example of First Embodiment: Another Example of Wiring Direction of Pixel Portion Auxiliary Cable)
3-7. Sixth Embodiment (Modified Example of First Embodiment: Another Example of Layout of Frame Portion Auxiliary Cable)
3-8. Seventh Embodiment (Example of Using Insulative Transparent Substrate as Substrate of Display Panel)
3-9. Eighth Embodiment (Modified Example of Second Embodiment: Example of Laying Out Pixel Portion Auxiliary Cable on Opposing Substrate Side)
4. Modified Example
5. Electronic Device of Present Disclosure
5-1. Specific Example 1 (Example of Digital Still Camera)
5-2. Specific Example 2 (Example of Head-Mounted Display)
6. Configuration That Can Be Employed in Present Disclosure <General Description about Display Device and Electronic Device According to Present Disclosure>

In a display device and an electronic device of the present disclosure, a fixed potential line can have a configuration of being a cathode cable that applies a fixed potential to a cathode electrode of a light emission unit. The cathode cable is preferably provided in a frame portion to surround a pixel array portion.

In the display device and the electronic device of the present disclosure that have the above-described preferable configuration, a pixel portion auxiliary cable can have a configuration of linearly formed along a column direction or a row direction, or the column direction and the row direction of a matrix-shaped pixel array of a pixel array portion. Furthermore, the pixel portion auxiliary cable can have a configuration of being formed in a hierarchy between a layer on which a circuit unit that drives a light emission unit is formed, and a layer on which the light emission unit is formed, or being formed in a hierarchy on an emission side of the light emission unit. The circuit unit that drives the light emission unit can have a configuration of being formed on a semiconductor substrate.

Furthermore, in the display device and the electronic device of the present disclosure that have the above-described preferable configuration, the pixel portion auxiliary cable can have a configuration of being formed in a hierarchy inferior to the layer on which the circuit unit that drives the light emission unit is formed. The circuit unit that drives the light emission unit can have a configuration of being formed on an insulative transparent substrate.

Furthermore, in the display device and the electronic device of the present disclosure that have the above-described preferable configuration, the light emission unit can have a configuration of including an organic electroluminescence element.

<Display Device to which Technology of Present Disclosure is Applied>

A display device to which the technology of the present disclosure is applied is an active matrix type display device that controls current flowing in an electrooptic element, using an active element provided in the same pixel circuit as the electrooptic element, such as an insulated gate field effect transistor, for example. As an insulated gate field effect transistor, typically, a metal oxide semiconductor (MOS) transistor and a thin film transistor (TFT) can be exemplified.

Here, as an example, the description will be given using an example of an active matrix type organic EL display device that uses a current drive type electrooptic element such as an organic EL element, for example, that changes in light emission luminance in accordance with a value of current flowing in a device, as a light emission unit (light emitting element) of a pixel circuit. Hereinafter, a "pixel circuit" will be sometimes simply described as a "pixel".

[System Configuration]

FIG. 1 is a system configuration diagram schematically illustrating a configuration of an organic EL display device to which the technology of the present disclosure is applied. As illustrated in FIG. 1, an organic EL display device 10 according to this application example has a configuration including a pixel array portion 30 including a plurality of pixels 20 including an organic EL element that is two-dimensionally arrayed in a matrix shape, and a peripheral circuit (peripheral drive unit) arranged in a frame portion around the pixel array portion 30.

The peripheral circuit includes, for example, a writing scanning unit 40 mounted on the same display panel 70 as the pixel array portion 30, a first drive scanning unit 50A, a second drive scanning unit 50B, a signal output unit 60, and the like, and drives each of the pixels 20 of the pixel array portion 30. Note that a configuration in which a part or all of the writing scanning unit 40, the first drive scanning unit 50A, the second drive scanning unit 50B, and the signal output unit 60 are provided on the outside of the display panel 70 can be employed.

As a substrate of the display panel 70, an insulative transparent substrate such as a glass substrate can be used, or a semiconductor substrate such as a silicon substrate can also be used. An organic EL display device that uses a semiconductor substrate such as a silicon substrate, as a substrate of the display panel 70 is referred to as a so-called micro display (compact display), and is preferably used as an electronic viewfinder of a digital still camera, a display unit of a head-mounted display, or the like.

The organic EL display device 10 can have a configuration supporting monochrome (black and white) display, and can also have a configuration supporting color display. In a case where the organic EL display device 10 supports color display, one pixel (unit pixel/pixel) serving as a unit of forming a color image includes a plurality of subpixels. At this time, each of the subpixels corresponds to the pixel 20 illustrated in FIG. 1. More specifically, in a display device supporting color display, one pixel includes, for example, three subpixels including a subpixel that emits red (R) light, a subpixel that emits green (G) light, and a subpixel that emits blue (B) light.

Nevertheless, the configuration of one pixel is not limited to a combination of RGB three primary color subpixels, and one pixel may include three primary color subpixels and further include one color or a plurality of colors. More specifically, for example, for enhancing luminance, one pixel can additionally include a subpixel that emits white (W) light, or for enlarging a color reproduction range, one pixel can additionally include at least one subpixel that emits complementary color light.

In the pixel array portion 30, for an array of pixels 20 in m rows and n columns, scanning lines $31_1$ to $31_m$, first drive lines $32_1$ to $32_m$, and second drive lines $33_1$ to $33_m$ are laid for each pixel row along a row direction (array direction of pixels in a pixel row). Moreover, for the array of pixels 20 in m rows and n columns, signal lines $34_1$ to $34_n$ are laid for each pixel column along a column direction (array direction of pixels in a pixel column). Hereinafter, in some cases, the scanning lines $31_1$ to $31_m$ will be collectively described as scanning lines 31, the first drive lines $32_1$ to $32_m$ will be collectively described as first drive lines 32, the second drive lines $33_1$ to $33_m$ will be collectively described as second drive lines 33, and the signal lines $34_1$ to $34_n$ will be collectively described as signal lines 34.

The scanning lines $31_1$ to $31_m$ are respectively connected to output ends of corresponding rows of the writing scanning unit 40. The drive lines $32_1$ to $32_m$ are respectively connected to output ends of corresponding rows of a drive scanning unit 50. The signal lines $34_1$ to $34_n$ are respectively connected to output ends of corresponding columns of the signal output unit 60.

The writing scanning unit 40 includes a shift register circuit, an address decoder, and the like. The writing scanning unit 40 performs so-called linear sequential scanning of sequentially scanning the pixels 20 of the pixel array portion 30 for each row by sequentially supplying writing scanning signals WS ($WS_1$ to $WS_m$) to the scanning lines 31 in writing a signal voltage of a video signal into each of the pixels 20 of the pixel array portion 30.

Similarly to the writing scanning unit 40, the first drive scanning unit 50A includes a shift register circuit, an address decoder, and the like. The first drive scanning unit 50A performs control of light emission/light non-emission (extinction) of the pixels 20 by supplying light emission control signals DS ($DS_1$ to $DS_m$) to the first drive lines 32 in synchronization with linear sequential scanning performed by the writing scanning unit 40.

Similarly to the writing scanning unit 40, the second drive scanning unit 50B includes a shift register circuit, an address decoder, and the like. The second drive scanning unit 50B performs control of preventing the pixels 20 from emitting light during a light non-emission period, by supplying drive signals AZ ($AZ_1$ to $AZ_m$) to the second drive lines 33 in synchronization with linear sequential scanning performed by the writing scanning unit 40.

The signal output unit 60 selectively outputs a signal voltage of a video signal (hereinafter, will be sometimes simply described as a "signal voltage") $V_{sig}$ that corresponds to luminance information supplied from a signal supply source (not illustrated), and a reference voltage $V_{ofs}$. Here, the reference voltage $V_{ofs}$ is a voltage corresponding to a voltage on which the signal voltage $V_{sig}$ of the video signal is based (for example, voltage corresponding to a black level of the video signal), or a voltage in the vicinity thereof. The reference voltage $V_{ofs}$ is used as an initialization voltage in performing a correction operation.

The signal voltage $V_{sig}$/reference voltage $V_{ofs}$ selectively output from the signal output unit 60 is written into the pixels 20 of the pixel array portion 30 via the signal lines 34 for each pixel row selected by linear sequential scanning performed by the writing scanning unit 40. In other words, the signal output unit 60 employs a drive configuration of linear sequential writing of writing the signal voltage $V_{sig}$ for each pixel row (line).

Meanwhile, in a case where pixel resolution of an organic EL display device is high, because a size of one pixel (or one subpixel) becomes smaller, layout in one pixel (or one subpixel) becomes tight every year. From such a reason, in a region of the pixel array portion 30 (pixel region), only an electrical cable, an electrode, and a transistor that are used in the pixels 20 are laid out.

[Pixel Circuit]

Figure 2:
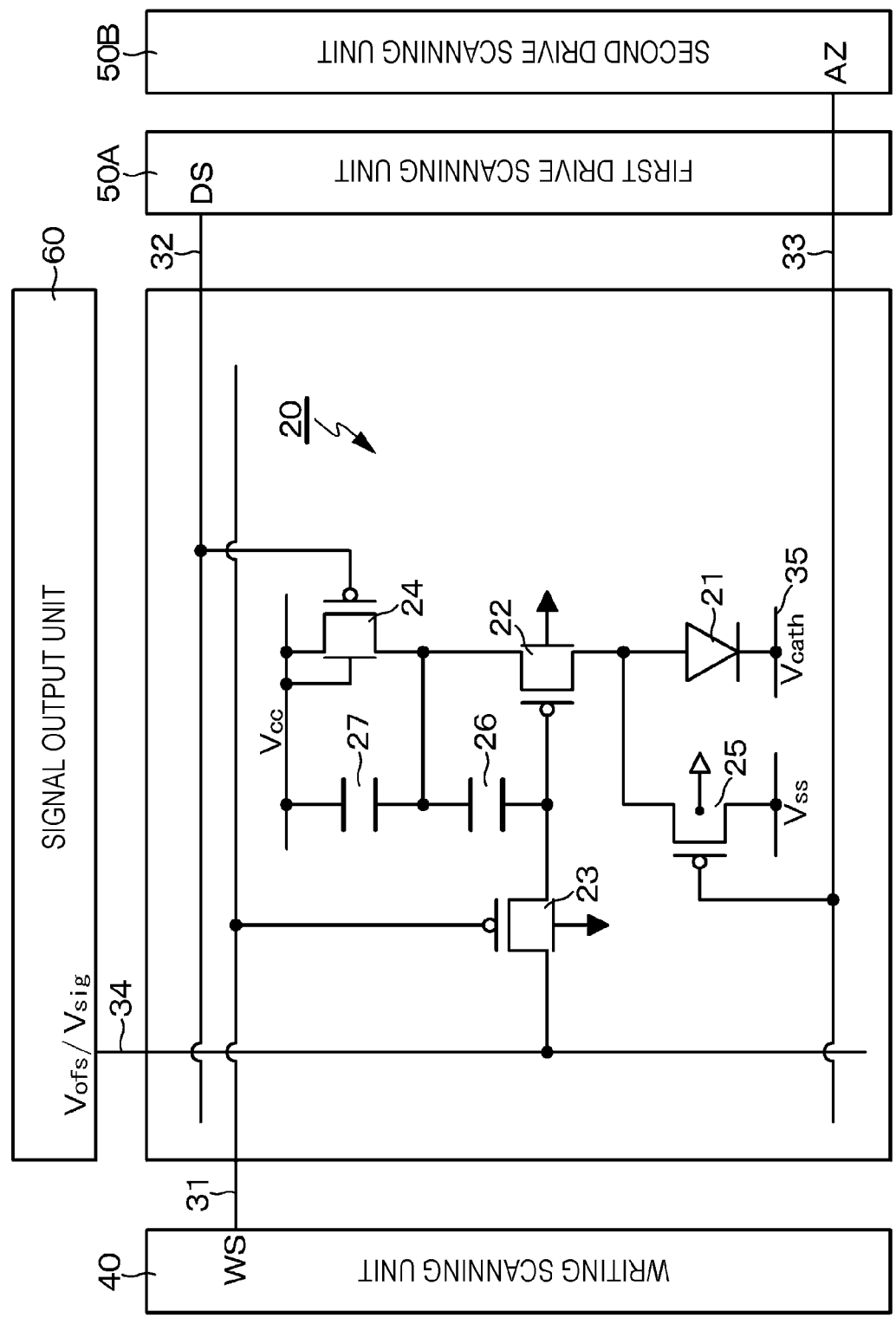
FIG. 2 is a circuit diagram illustrating an example of a circuit configuration of a pixel (pixel circuit) in an organic EL display device to which the technology of the present disclosure is applied.

FIG. 2 is a circuit diagram illustrating an example of a circuit configuration of a pixel (pixel circuit) in the organic EL display device 10 to which the technology of the present disclosure is applied. A light emission unit of the pixel 20 includes an organic EL element 21. The organic EL element 21 is an example of a current drive type electrooptic element having light emission luminance changing in accordance with a value of current flowing in the device.

As illustrated in FIG. 2, the pixel 20 includes the organic EL element 21, and a drive circuit (pixel drive circuit) that drives the organic EL element 21 by flowing current in the organic EL element 21. A cathode electrode of the organic EL element 21 is formed as a common electrode shared by all the pixels 20. Then, a predetermined cathodic potential $V_{cath}$ is applied to the cathode electrode of the organic EL element 21 through a cathode cable 35.

A drive circuit unit that drives the organic EL element 21 has a four-transistor (4Tr)/two-capacitative element (2C) configuration including a drive transistor 22, a writing transistor (sampling transistor) 23, a light emission control transistor 24, a switching transistor 25, a holding capacitance 26, and an auxiliary capacitance 27. Note that, in this example, the pixel (pixel circuit) 20 is not formed on an insulating material such as a glass substrate but on a semiconductor substrate such as a silicon substrate. Then, the drive transistor 22 includes a p-channel type transistor.

Furthermore, in this example, the writing transistor 23, the light emission control transistor 24, and the switching transistor 25 employ a configuration of using a p-channel type transistor similarly to the drive transistor 22. Accordingly, the drive transistor 22, the writing transistor 23, the light emission control transistor 24, and the switching transistor 25 have a four-terminal configuration including source/gate/drain/back gate instead of a three-terminal configuration including source/gate/drain. A source voltage $V_{cc}$ is applied to a back gate of each transistor.

In the pixel 20 having the above-described configuration, the writing transistor 23 performs writing into a gate electrode of the drive transistor 22 by sampling the signal voltage $V_{sig}$ supplied from the signal output unit 60 through the signal line 34. The light emission control transistor 24 is connected between a power source line of the source voltage $V_{cc}$ and a source electrode of the drive transistor 22, and controls light emission/light non-emission of the organic EL element 21 under the driving performed in accordance with the light emission control signal DS. The switching transistor 25 is connected between a drain electrode of the drive transistor 22 and a current discharge destination node (for example, a common power source line 35), and controls the organic EL element 21 not to emit light during the light non-emission period of the organic EL element 21, under the driving performed in accordance with the drive signal AZ.

The holding capacitance 26 is connected between the gate electrode and the source electrode of the drive transistor 22, and holds the signal voltage $V_{sig}$ written into by the sampling performed by the writing transistor 23. The drive transistor 22 drives the organic EL element 21 by flowing drive current corresponding a voltage held by the holding capacitance 26, in the organic EL element 21. The auxiliary capacitance 27 is connected between the source electrode of the drive transistor 22 and a node with a fixed potential (for example, the power source line of the source voltage $V_{cc}$). The auxiliary capacitance 27 has a function of suppressing a variation in source voltage of the drive transistor 22 when the signal voltage $V_{sig}$ is written into, and has a function of setting a gate-source voltage $V_{gs}$ of the drive transistor 22 to a threshold voltage Vth of the drive transistor 22.

[Conventional Panel Wiring Structure]

Figure 3A:
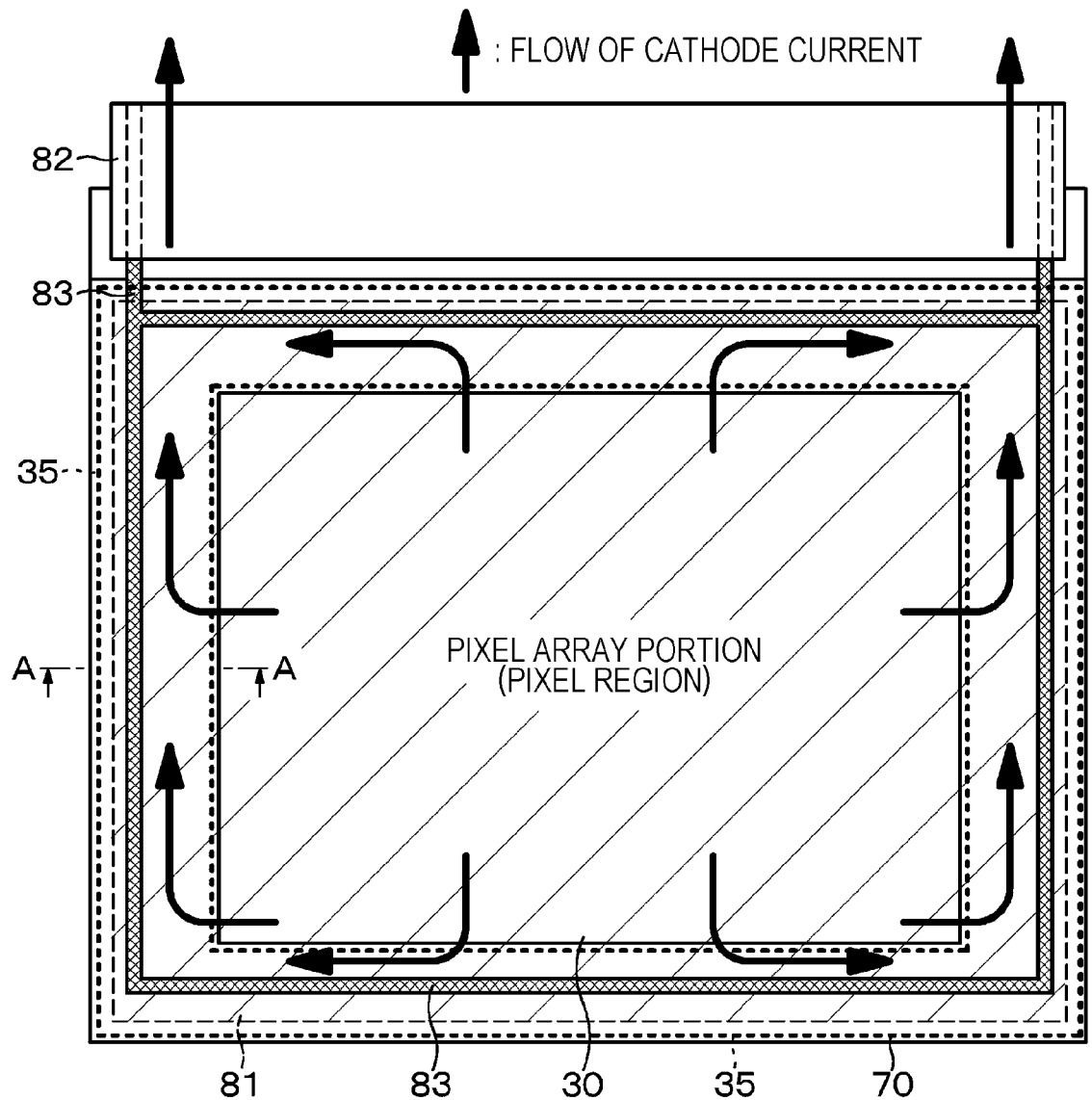
FIG. 3A is a plan view schematically illustrating a display panel having a conventional panel wiring structure.
Figure 3B:
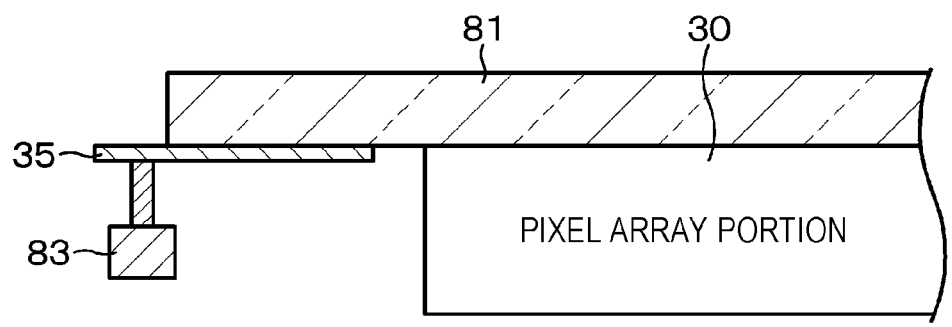
FIG. 3B is a cut portion end view illustrating a cross section cut along an A-A line in FIG. 3A, and conceptually illustrating a connection relationship between a cathode electrode, a cathode cable, and a frame portion auxiliary cable.

Here, a conventional panel wiring structure in the organic EL display device 10 will be described. FIG. 3A illustrates a schematic plan view of the display panel 70 having the conventional panel wiring structure, and FIG. 3B illustrates a cut portion end view taken along an A-A line in FIG. 3A. FIG. 3B also serves as a conceptual diagram illustrating a connection relationship between a cathode electrode 81, the cathode cable 35, and a frame portion auxiliary cable 83.

The cathode electrode 81 of the organic EL element 21 includes a transparent electrode, and is formed over the entire display panel 70 including a region of the pixel array portion 30 (pixel region). As a material of the cathode electrode 81, for example, a material such as indium tin oxide (ITO), indium zinc oxide (IZO), or zinc oxide (ZnO) can be used.

In FIG. 3A, hatching is added to a region of the cathode electrode 81 that is surrounded by a broke line. Furthermore, in a peripheral portion of the cathode electrode 81, the cathode cable 35 (in FIG. 3A, a region surrounded by a dashed line) for applying the cathodic potential $V_{cath}$ to the cathode electrode 81 is provided to surround the pixel array portion 30. As a material of the cathode cable 35, for example, a material of an anode electrode of the organic EL element 21, specifically, a metal material such as aluminum (Al) or a stacked layer of indium tin oxide (ITO) and silver (Ag) can be used.

On one side (upper side in the diagram) in a column direction of a matrix-shaped array of the pixel array portion 30, a flexible printed circuit board 82 for electrically connecting the display panel 70 and an external drive substrate (not illustrated) is provided. Furthermore, in a frame portion 70A around the pixel array portion 30, the frame portion auxiliary cable 83 is laid out to surround the pixel array portion 30. The frame portion auxiliary cable 83 is electrically connected with an external drive substrate through the flexible printed circuit board 82.

The cathode cable 35 provided in a peripheral portion of the cathode electrode 81 is electrically connected to the frame portion auxiliary cable 83 provided in a peripheral region of the pixel array portion 30. Therefore, the cathodic potential $V_{cath}$ is applied from an external drive substrate to the cathode electrode 81 through a route of the external drive substrate→a terminal portion of the flexible printed circuit board 82→the frame portion auxiliary cable 83→the cathode cable 35→the cathode electrode 81.

Meanwhile, as one of methods for achieving higher luminance in the organic EL display device 10, there is a method of increasing an amount of current flowing in the organic EL element 21. Nevertheless, an increase in current amount per unit area of the organic EL element 21 accelerates deterioration of the organic EL element 21. As a countermeasure, the deterioration can be prevented by increasing an opening ratio of the pixel 20, and increasing a current amount per pixel while suppressing an increase in current amount per unit area of the organic EL element 21. Therefore, it is possible to achieve higher luminance while suppressing deterioration of the organic EL element 21.

However, in a case where higher luminance is achieved using a method of increasing a current amount per pixel while suppressing an increase in current amount per unit area of the organic EL element 21, the entire current amount of the organic EL display device 10 increases. The cathode cable 35 needs to be widely laid out, and the cathode cable 35 needs to have a capacity to flow an increased current amount.

As indicated by arrows in FIG. 3A, cathode current after light emission of the organic EL element 21 flows into an external drive substrate through a route of the cathode electrode 81 of the pixel 20→the frame portion auxiliary cable 83→the terminal portion of the flexible printed circuit board 82. Accordingly, because the frame portion auxiliary cable 83 is a part of a route in which cathode current flows, the frame portion auxiliary cable 83 can also be said to be a cathode cable.

Here, because an electrical cable laid out in the frame portion 70A is also used as an electrical cable of a peripheral circuit portion, depending on a circuit configuration of the peripheral circuit portion, in some cases, the cathode cable 35 laid out in the frame portion 70A cannot have a sufficient capacity. For example, because a wiring region of the frame portion 70A is decreased by an increase in circuit configuration of the peripheral circuit portion that is caused in accordance with an increase in the number of pixels attributed to higher resolution, and it becomes impossible to widely lay out the cathode cable 35, interconnection resistance of the cathode cable 35 increases in some cases.

The same applies to a display device aiming to have a narrower frame. Due to a narrower frame, a wiring region cannot be sufficiently secured, and interconnection resistance of the cathode cable 35 cannot be sufficiently decreased in some cases. Furthermore, in a case where the frame portion auxiliary cable 83 cannot be widely laid out, the cathode cable 35 becomes a dominant path of current. Therefore, because the resistance of the cathode cable 35 becomes higher and current flowing in the cathode cable 35 is restricted, this becomes an obstructive factor of higher luminance, and negative impact on image quality is generated. In other words, for promoting higher performance of a display device, it is difficult to satisfy all of enhancement of pixel resolution, higher luminance, and a narrower frame.

Embodiment of Present Disclosure

In an embodiment of the present disclosure, in the organic EL display device 10 in which the cathode cable 35 to which the cathodic potential $V_{cath}$ is applied is laid out in the frame portion 70A of the display panel 70, the following configuration is employed as a panel wiring structure for satisfying all of enhancement of pixel resolution, higher luminance, and a narrower frame.

Figure 4:
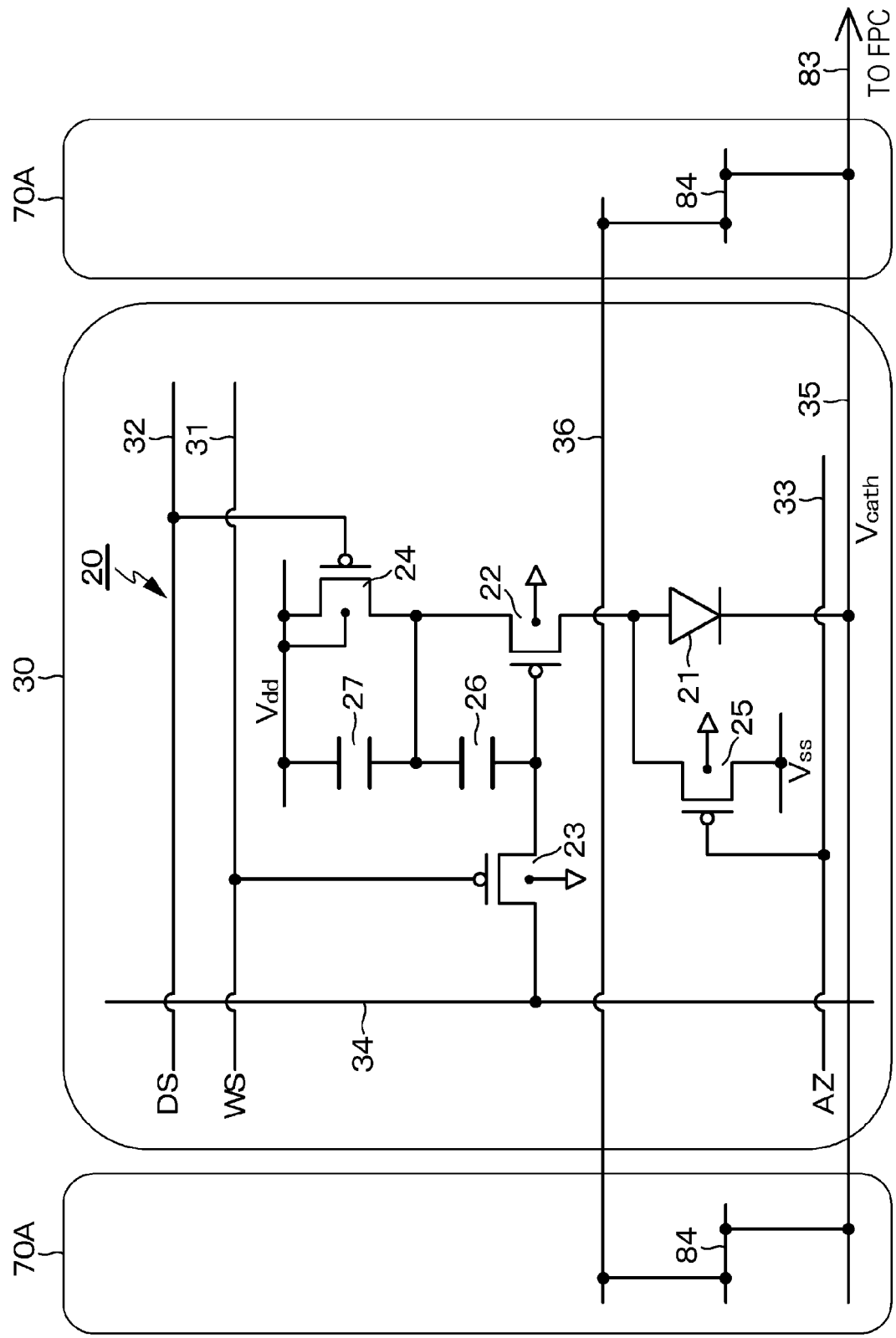
FIG. 4 is a circuit diagram illustrating an example of a circuit configuration of a pixel (pixel circuit) according to an embodiment of the present disclosure.

More specifically, as illustrated in FIG. 4, the present embodiment employs a configuration in which a pixel portion auxiliary cable 36 that does not supply power to any electrode is provided in the pixel array portion 30, and in the frame portion 70A, the pixel portion auxiliary cable 36 is electrically connected to the cathode cable 35 via a relay cable 84, for example. The cathodic potential $V_{cath}$ is a fixed potential, and accordingly, the cathode cable 35 is an example of a fixed potential line.

The pixel portion auxiliary cable 36 functions as a part of the cathode cable 35 by being electrically connected to the cathode cable 35. This means that a path in which cathode current of the organic EL element 21 flows increases. Then, by a current path increasing, interconnection resistance of the cathode cable 35 is reduced. Therefore, it is possible to reduce interconnection resistance of the cathode cable 35 without enlarging a region of the frame portion 70A with a view to widely laying out interconnection resistance of the cathode cable 35.

In other words, in a case where the interconnection resistance of the cathode cable 35 may be set to the same value as that of when the pixel portion auxiliary cable 36 is not provided, it is possible to reduce a region of the frame portion 70A, that is to say, narrow the frame of the display panel 70 by a reduced amount of interconnection resistance of the cathode cable 35. In this case, because interconnection resistance of the cathode cable 35 does not increase, it is possible to achieve a narrower frame of the display panel 70 while maintaining luminance and without deteriorating image quality.

Furthermore, in a display device having high pixel resolution, even in a case where a circuit configuration of the peripheral circuit portion increases in accordance with an increase in the number of pixels, and a wiring region of the frame portion 70A is accordingly decreased, interconnection resistance of the cathode cable 35 can be reduced without being affected by the increase and the decrease. Therefore, higher luminance can be achieved because current flowing in the cathode cable 35 is not restricted.

Furthermore, as described above, regarding an opening ratio of the pixel 20 that serves as one factor for increasing resistance of the cathode cable 35 in achieving higher luminance, because there is no need to make contact by the pixel 20 by electrically connecting the pixel portion auxiliary cable 36 to the cathode cable 35, interconnection resistance of the cathode cable 35 can be reduced without affecting the opening ratio.

As described above, the panel wiring structure according to the present embodiment has a configuration in which the pixel portion auxiliary cable 36 is provided in the pixel array portion 30, and the pixel portion auxiliary cable 36 is electrically connected to the cathode cable 35. According to the panel wiring structure, because interconnection resistance of the cathode cable 35 can be reduced while maintaining the layout (wiring state) of the cathode cable 35, all of enhancement of pixel resolution, higher luminance, and a narrower frame can be satisfied in prompting higher performance of the organic EL display device 10.

Hereinafter, a specific embodiment of the present embodiment of reducing interconnection resistance of the cathode cable 35 by electrically connecting the pixel portion auxiliary cable 36 to the cathode cable 35 will be described.

First Embodiment

Figure 5A:
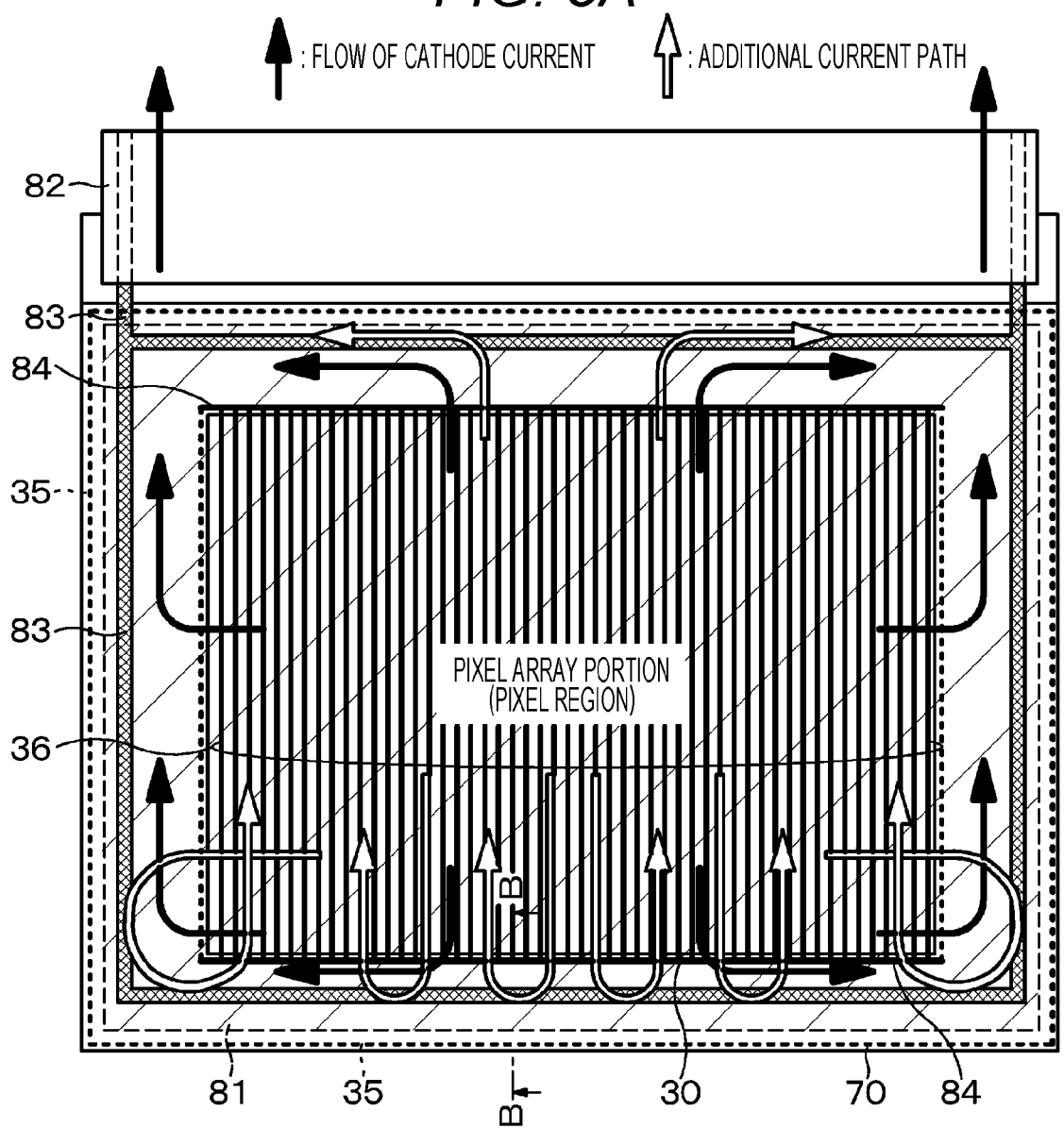
FIG. 5A is a plan view schematically illustrating a display panel having a panel wiring structure according to a first embodiment.
Figure 5B:
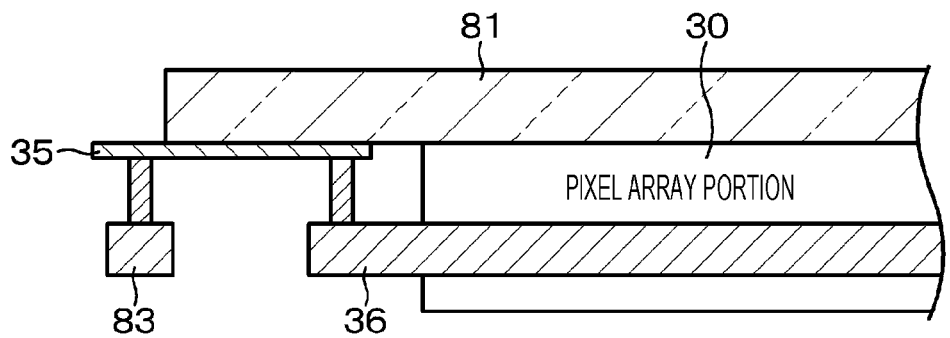
FIG. 5B is a cut portion end view illustrating a cross section cut along a B-B line in FIG. 5A, and conceptually illustrating a connection relationship between a cathode electrode, a pixel portion auxiliary cable, a cathode cable, and a frame portion auxiliary cable.

The first embodiment is a basic form of the panel wiring structure according to the present embodiment, and is an example of using a semiconductor substrate such as a silicon substrate, as a substrate of the display panel 70. FIG. 5A illustrates a schematic plan view of the display panel 70 having the panel wiring structure according to the first embodiment, and FIG. 5B illustrates a cut portion end view taken along a B-B line in FIG. 5A. FIG. 5B also serves as a conceptual diagram illustrating a connection relationship between the cathode electrode 81, the pixel portion auxiliary cable 36, the cathode cable 35, and the frame portion auxiliary cable 83.

In FIG. 5A, hatching is added to a region of the cathode electrode 81 that is surrounded by a broke line. The cathode electrode 81 includes a transparent electrode and is shared by all pixels. Furthermore, in a peripheral portion of the cathode electrode 81, the cathode cable 35 (in FIG. 5A, a region surrounded by a dashed line) for applying the cathodic potential $V_{cath}$ to the cathode electrode 81 is provided to surround the pixel array portion 30 in the frame portion 70A of the display panel 70.

In the panel wiring structure according to the first embodiment, in the pixel array portion 30, at least one pixel portion auxiliary cable 36, or preferably, a plurality of pixel portion auxiliary cables 36 is formed along the column direction (up-down direction in the diagram) of a matrix-shaped pixel array. Each of the plurality of pixel portion auxiliary cables 36 is an electrical cable that does not supply power to any electrode in an effective display region of the pixel array portion 30. The plurality of pixel portion auxiliary cables 36 is electrically connected to the relay cable 84 on the upper side and the lower side of the pixel array portion 30. Moreover, the plurality of pixel portion auxiliary cables 36 is electrically connected to the cathode cable 35 via the relay cable 84.

In the panel wiring structure according to the first embodiment that has the above-described configuration, the cathode cable 35 includes, for example, the same metal material (anode metal) as an anode electrode of the organic EL element 21. Furthermore, the frame portion auxiliary cable 83 includes the same metal material (circuit metal) as an electrical cable of the peripheral circuit portion of the pixel array portion 30. Then, interconnection resistance of the frame portion auxiliary cable 83 that uses circuit metal is low-value resistance by about $\frac{1}{10}$ to $\frac{1}{15}$ as compared with interconnection resistance of the cathode cable 35 that uses anode metal, for example. As an example, interconnection resistance of the cathode cable 35 that uses anode metal is about 1.4 Ω/sq, and interconnection resistance of the frame portion auxiliary cable 83 that uses circuit metal is about 0.16 to 0.09/sq.

Because the plurality of pixel portion auxiliary cables 36 functions as a part of the cathode cable 35 by being electrically connected to the cathode cable 35, a current path in which cathode current of the organic EL element 21 flows increases. Then, by a current path in which cathode current flows increasing as for the cathode cable 35, interconnection resistance of the cathode cable 35 can be reduced. In FIG. 5A, an original flow of cathode current of the organic EL element 21 is indicated by a black solid arrow, and a current path added by the panel wiring structure according to the first embodiment is indicated by a white unfilled arrow.

Second Embodiment

Figure 6:
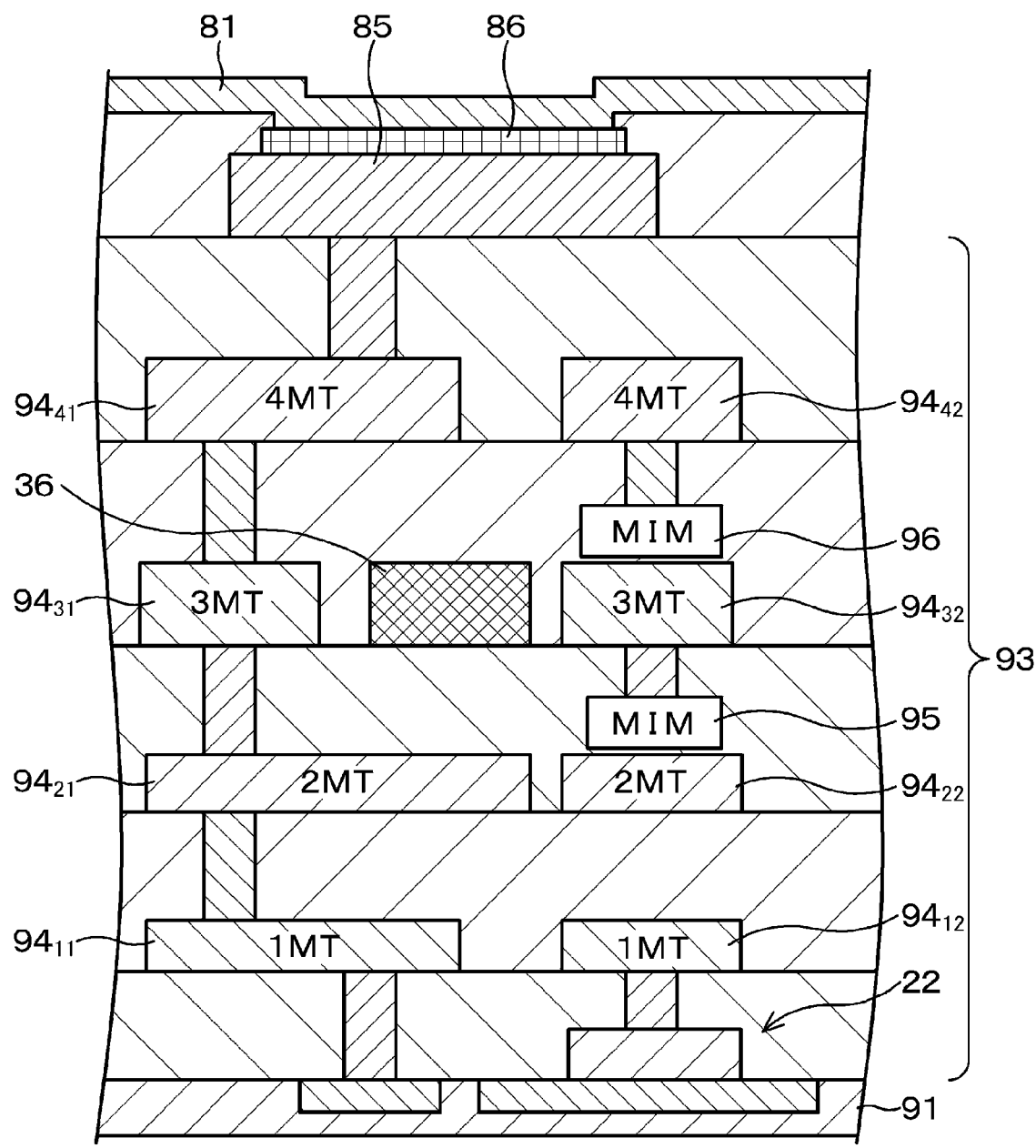
FIG. 6 is a cross-sectional view illustrating a cross-sectional structure of a panel wiring structure according to a second embodiment.

The second embodiment is a first example of a cross-sectional structure in the panel wiring structure according to the first embodiment. FIG. 6 illustrates a cross-sectional structure of a panel wiring structure according to the second embodiment.

A circuit unit that drives the pixels 20 including the organic EL element 21, such as a circuit layer 92 including the drive transistor 22 or the like, for example, is formed on a semiconductor substrate 91 such as a silicon substrate, and four wiring layers 93, for example, are stacked on the circuit layer 92. In the respective wiring layers of the four wiring layers 93, metal cables (1MT) $94_{11}$ and $94_{12}$ of the first layer, metal cables (2MT) $94_{21}$ and $94_{22}$ of the second layer, metal cable (3MT) $94_{31}$ and $94_{32}$ of the third layer, and metal cables (4MT) $94_{41}$ and $94_{42}$ of the fourth layer are formed.

The metal cables formed in the respective wiring layers of the four wiring layers 93 are used as power source cables that supply power to the pixels 20. Furthermore, for example, metal insulator metal (MIM) capacitances 95 and 96 that can be used as circuit elements (the holding capacitance 26 and the auxiliary capacitance 27) of the pixels 20 are formed in the second and third wiring layers.

Then, on the fourth wiring layer, an anode electrode 85 is formed for each pixel, and an organic EL layer 86 is formed thereon. The organic EL layer 86 has a stacked structure in which a hole injection layer, a hole transport layer, a light emission layer, an electronic transport layer, and an electronic injection layer are stacked in order from the side of the anode electrode 85. On the organic EL layer 86, the cathode electrode 81 including a transparent electrode is formed to be shared by all the pixels.

In the panel structure having the above-described configuration, the respective wiring layers of the four wiring layers 93 are electrically connected with each other via a contact portion appropriately. Then, in the panel wiring structure according to the second embodiment, the pixel portion auxiliary cable 36 for reducing interconnection resistance of the cathode cable 35 is formed in the third wiring layer, for example, in which the metal cables (3MT) $94_{31}$ and $94_{32}$ having a function different from the pixel portion auxiliary cable 36 exist in the same hierarchy in the four wiring layers 93. The pixel portion auxiliary cable 36 is connected to none of the pixels 20. Here, the pixel portion auxiliary cable 36 is formed in the third wiring layer, but the pixel portion auxiliary cable 36 may be formed in the first, second, or fourth layer.

It is preferable that the pixel portion auxiliary cable 36 is laid out below the anode electrode 85, that is to say, laid out to overlap the anode electrode 85 in a planar view. According to the layout of the pixel portion auxiliary cable 36, an opening ratio of the pixel 20 is not decreased. In other words, it is possible to lay out the pixel portion auxiliary cable 36 in the pixel array portion 30 without decreasing an opening ratio of the pixel 20.

Third Embodiment

Figure 7:
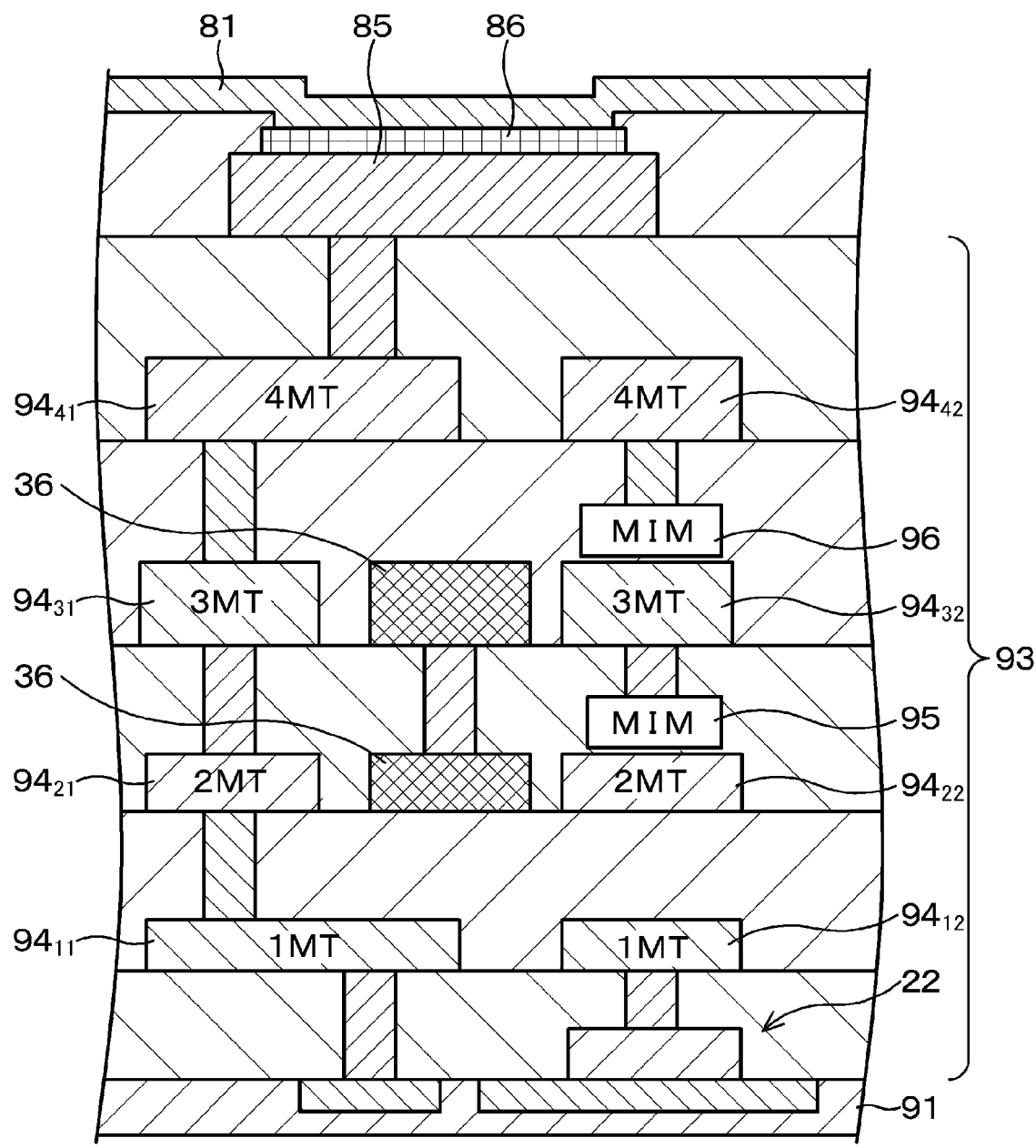
FIG. 7 is a cross-sectional view illustrating a cross-sectional structure of a panel wiring structure according to a third embodiment.

The third embodiment is a second example of a cross-sectional structure in the panel wiring structure according to the first embodiment. FIG. 7 illustrates a cross-sectional structure of a panel wiring structure according to the third embodiment.

In the panel wiring structure according to the third embodiment, the pixel portion auxiliary cable 36 for reducing interconnection resistance of the cathode cable 35 is formed over the second and third wiring layers, for example, in the four wiring layers 93. Then, the pixel portion auxiliary cable 36 in the second layer and the pixel portion auxiliary cable 36 in the third layer are electrically connected via a contact portion. Also in the present embodiment, the pixel portion auxiliary cable 36 is connected to none of the pixels 20.

Fourth Embodiment

Figure 8:
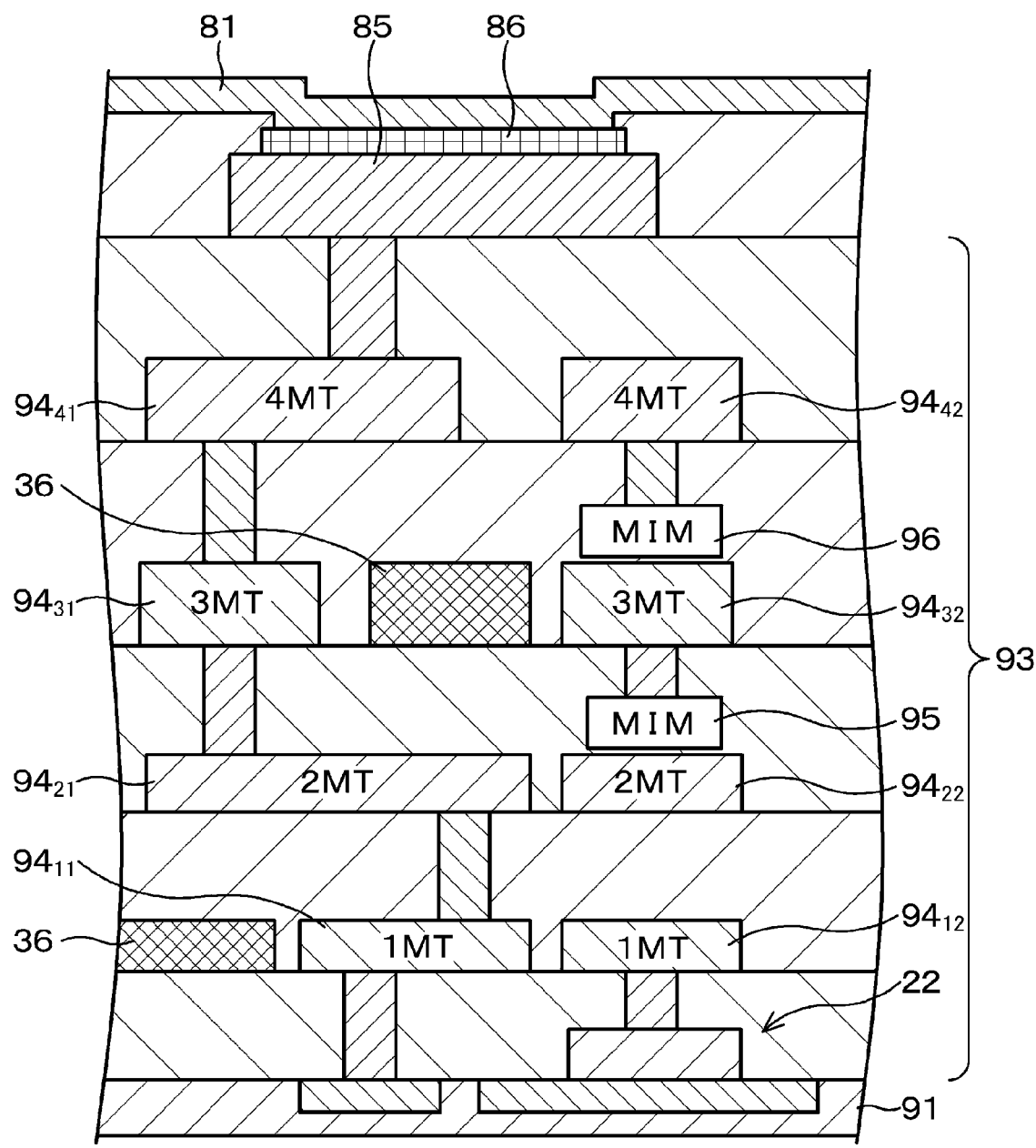
FIG. 8 is a cross-sectional view illustrating a cross-sectional structure of a panel wiring structure according to a fourth embodiment.

The fourth embodiment is a third example of a cross-sectional structure in the panel wiring structure according to the first embodiment. FIG. 8 illustrates a cross-sectional structure of a panel wiring structure according to the fourth embodiment.

In the panel wiring structure according to the fourth embodiment, the pixel portion auxiliary cable 36 for reducing interconnection resistance of the cathode cable 35 is formed over the first and third wiring layers, for example, in the four wiring layers 93. Also in the present embodiment, the pixel portion auxiliary cable 36 is connected to none of the pixels 20.

Note that, when the pixel portion auxiliary cable 36 is formed over a plurality of layers, the pixel portion auxiliary cable 36 is formed over the second and third wiring layers in the third embodiment, and the pixel portion auxiliary cable 36 is formed over the first and third wiring layers in the fourth embodiment, but the pixel portion auxiliary cable 36 may be formed over another combination of two layers. Furthermore, a plurality of layers forming the pixel portion auxiliary cable 36 is not limited to two layers, and may be three layers or more.

Fifth Embodiment

Figure 9A:
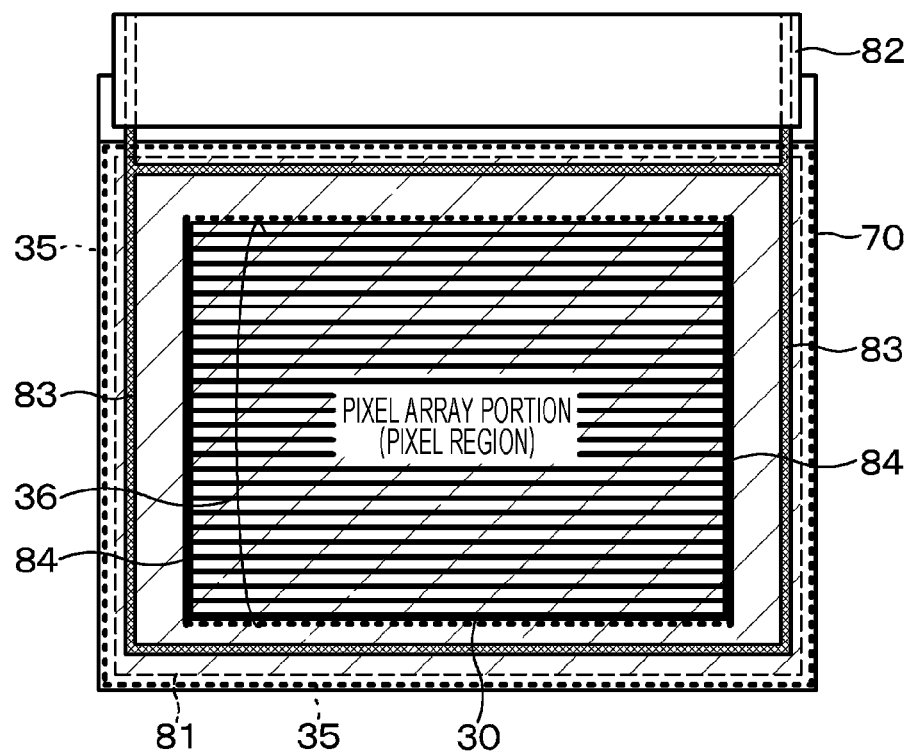
FIGS. 9A and 9B are schematic plan views illustrating a panel wiring structure according to a fifth embodiment.
Figure 9B:
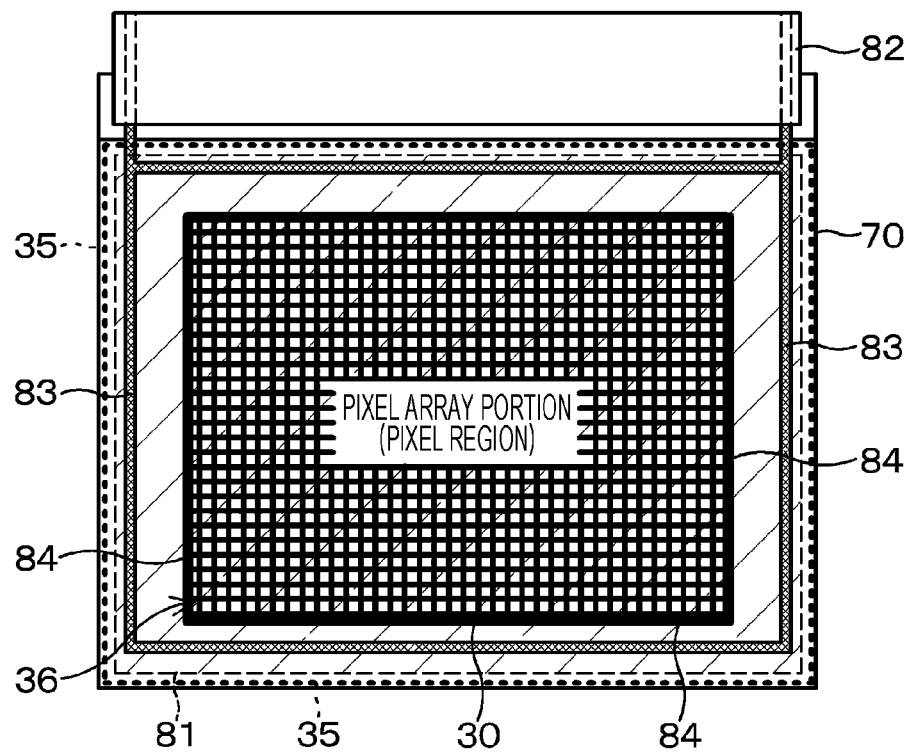

The fifth embodiment is a modified example of the first embodiment, and another example of a wiring direction of the pixel portion auxiliary cable 36. FIGS. 9A and 9B illustrate another example of a wiring direction of the pixel portion auxiliary cable 36 according to the fifth embodiment.

The panel wiring structure according to the first embodiment has a configuration in which, in the pixel array portion 30, a plurality of pixel portion auxiliary cables 36 is preferably formed along the column direction (up-down direction in the diagram) of a matrix-shaped pixel array. In contrast to this, the panel wiring structure according to the fifth embodiment has a configuration in which a plurality of pixel portion auxiliary cables 36 is preferably formed along a row direction (left-right direction in the diagram) of a matrix-shaped pixel array as illustrated in FIG. 9A, or is formed like a mesh along the column direction and the row direction as illustrated in FIG. 9B.

In other words, as the wiring direction of the pixel portion auxiliary cable 36, one direction of the column direction of the matrix-shaped pixel array can be set as in the case of the first embodiment, or one direction of the row direction or two directions of the column direction and the row direction can also be set as in the case of the fifth embodiment. In any case, it is assumed that the pixel portion auxiliary cable 36 for reducing interconnection resistance of the cathode cable 35 is formed not into a surface shape but into a linear shape. As illustrated in FIG. 9B, in a case where the pixel portion auxiliary cables 36 are formed like a mesh along the column direction and the row direction, as illustrated in FIGS. 7 and 8, the pixel portion auxiliary cables 36 are formed over a plurality of layers.

Sixth Embodiment

Figure 10:
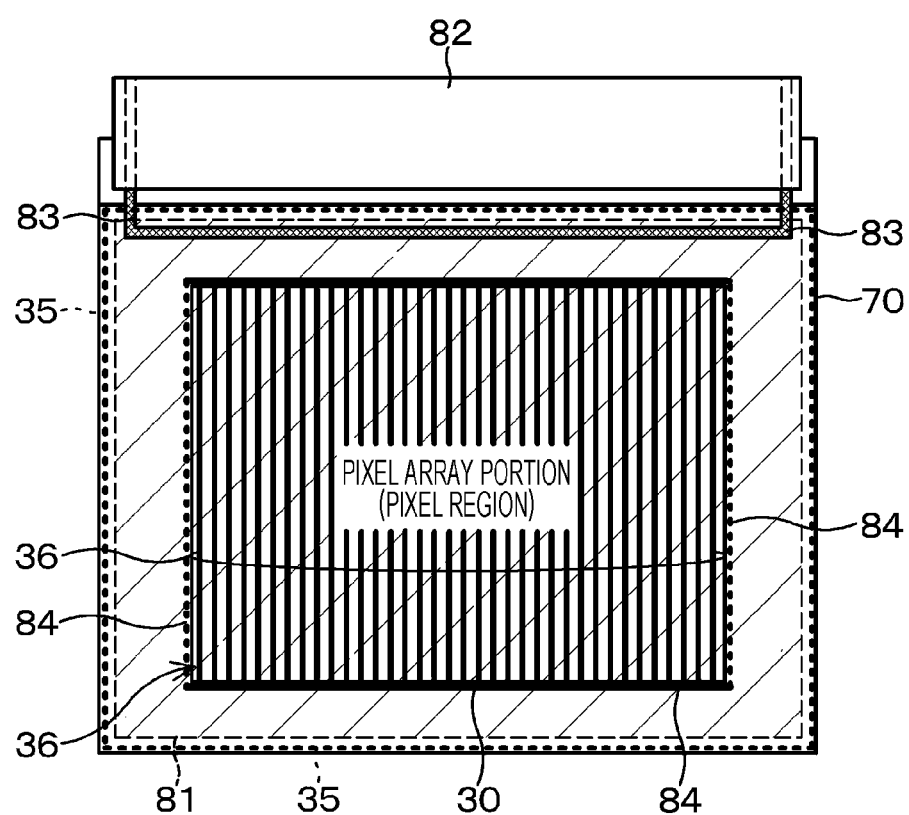
FIG. 10 is a schematic plan view illustrating a panel wiring structure according to a sixth embodiment.

The sixth embodiment is a modified example of the first embodiment, and another example of layout of the frame portion auxiliary cable 83. FIG. 10 illustrates another example of layout of the frame portion auxiliary cable 83 according to the sixth embodiment.

The panel wiring structure according to the first embodiment has a configuration in which the frame portion auxiliary cable 83 functioning as a part of a cathode electrode that flows cathode current of the organic EL element 21 is laid out in the frame portion 70A of the display panel 70 to surround the pixel array portion 30. In contrast to this, the panel wiring structure according to the sixth embodiment has a configuration in which the frame portion auxiliary cable 83 is laid out in the frame portion 70A on the flexible printed circuit board 82 side in the display panel 70 as illustrated in FIG. 10. In this manner, even in a configuration in which the frame portion auxiliary cable 83 is laid out in a part of the frame portion 70A, a function and an effect that are similar to those in a case where the frame portion auxiliary cable 83 is laid out to surround the pixel array portion 30 as in the first embodiment can be obtained.

Seventh Embodiment

The seventh embodiment is an example of using an insulative transparent substrate having optical transparency, as a substrate of the display panel 70. As an insulative transparent substrate, a quartz substrate, a glass substrate, and the like can be exemplified. The pixel 20 is formed on a transparent substrate such as a quartz substrate or a glass substrate, and a transistor of the pixel 20 is formed using a thin film transistor (TFT).

Polysilicon used in the TFT is classified into high temperature polysilicon for forming a thin film under a high-temperature environment, and low temperature polysilicon for forming a thin film under a low-temperature environment. Then, generally, a glass substrate is used in a low temperature polysilicon display panel, and a quartz substrate is used in a high temperature polysilicon display panel.

Figure 11:
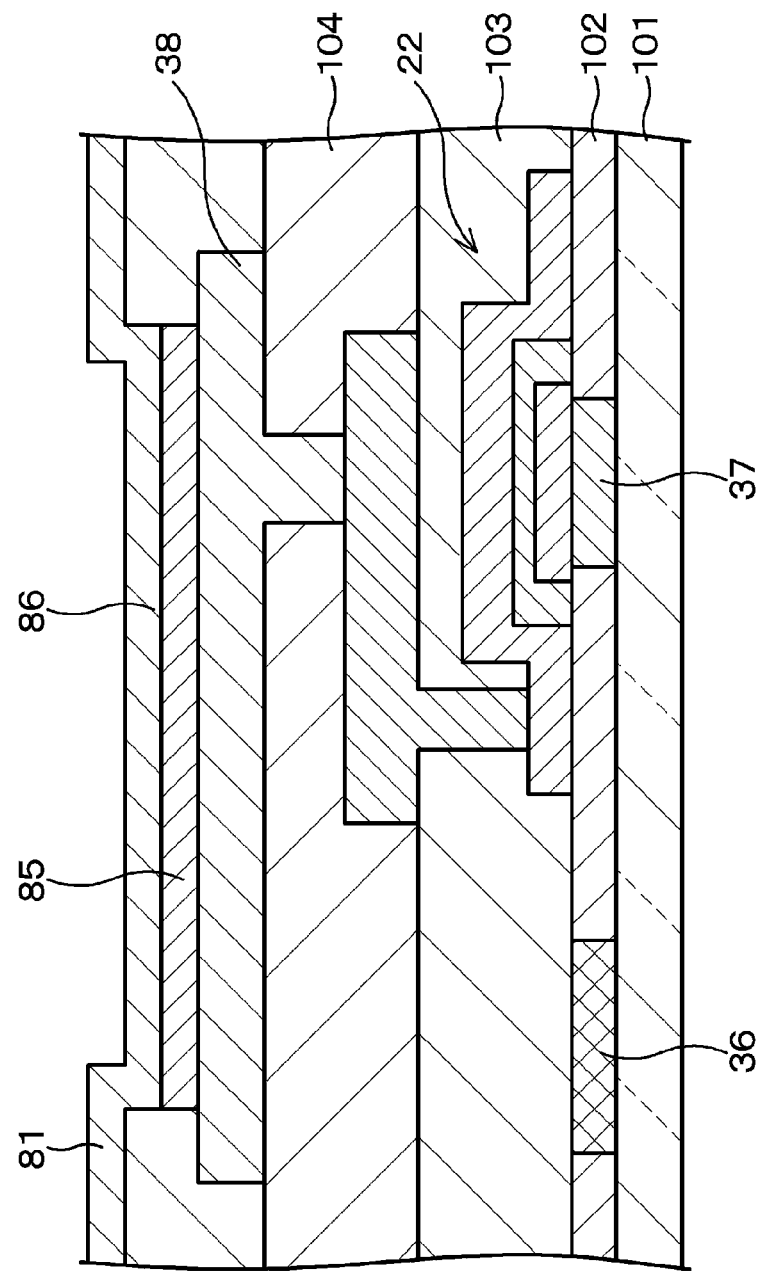
FIG. 11 is a cross-sectional view illustrating a cross-sectional structure of a panel wiring structure according to a seventh embodiment.

FIG. 11 illustrates a cross-sectional structure of a panel wiring structure according to the seventh embodiment. Here, a case of a low temperature polysilicon display panel that uses a glass substrate 101 as a substrate of the display panel 70 is exemplified. A circuit unit that drives the pixels 20 including the organic EL element 21, such as a circuit layer 103 including the drive transistor 22, for example, is stacked on the glass substrate 101 via a wiring layer 102. At a position below the drive transistor 22 in the wiring layer 102, a metal cable 37 that aids the gate of the drive transistor 22 is formed.

A wiring layer 104 including an electrical cable 38 such as aluminum is stacked on the circuit layer 103, the anode electrode 85 is formed thereon for each pixel, and the organic EL layer 86 is formed thereon. The electrical cable 38 such as aluminum is electrically connected to one of source/drain electrodes of the drive transistor 22, and the anode electrode 85. On the organic EL layer 86, the cathode electrode 81 including a transparent electrode is formed to be shared by all the pixels.

In the panel structure having the above-described configuration, the pixel portion auxiliary cable 36 for reducing interconnection resistance of the cathode cable 35 is formed in the wiring layer 102 including the circuit unit that drives the pixels 20 including the organic EL element 21. The pixel portion auxiliary cable 36 is connected to none of the pixels 20. From the viewpoint of an opening ratio of the pixel 20, it is preferable that the pixel portion auxiliary cable 36 is laid out below the anode electrode 85, that is to say, laid out to overlap the anode electrode 85 in a planar view.

Here, a case of a low temperature polysilicon display panel that uses the glass substrate 101 as a substrate of the display panel 70 has been exemplified, but a similar configuration can be employed for a high temperature polysilicon display panel that uses a quartz substrate. Then, in both cases of the low temperature polysilicon display panel and the high temperature polysilicon display panel, the pixel portion auxiliary cable 36 can be laid out in a hierarchy inferior to the circuit layer 103 including the drive transistor 22. In other words, a hierarchy in which the pixel portion auxiliary cable 36 is laid out is not limited to a hierarchy between a layer on which a circuit unit such as the drive transistor 22 is formed and a layer on which the organic EL element 21 is formed.

Eighth Embodiment

Figure 12:
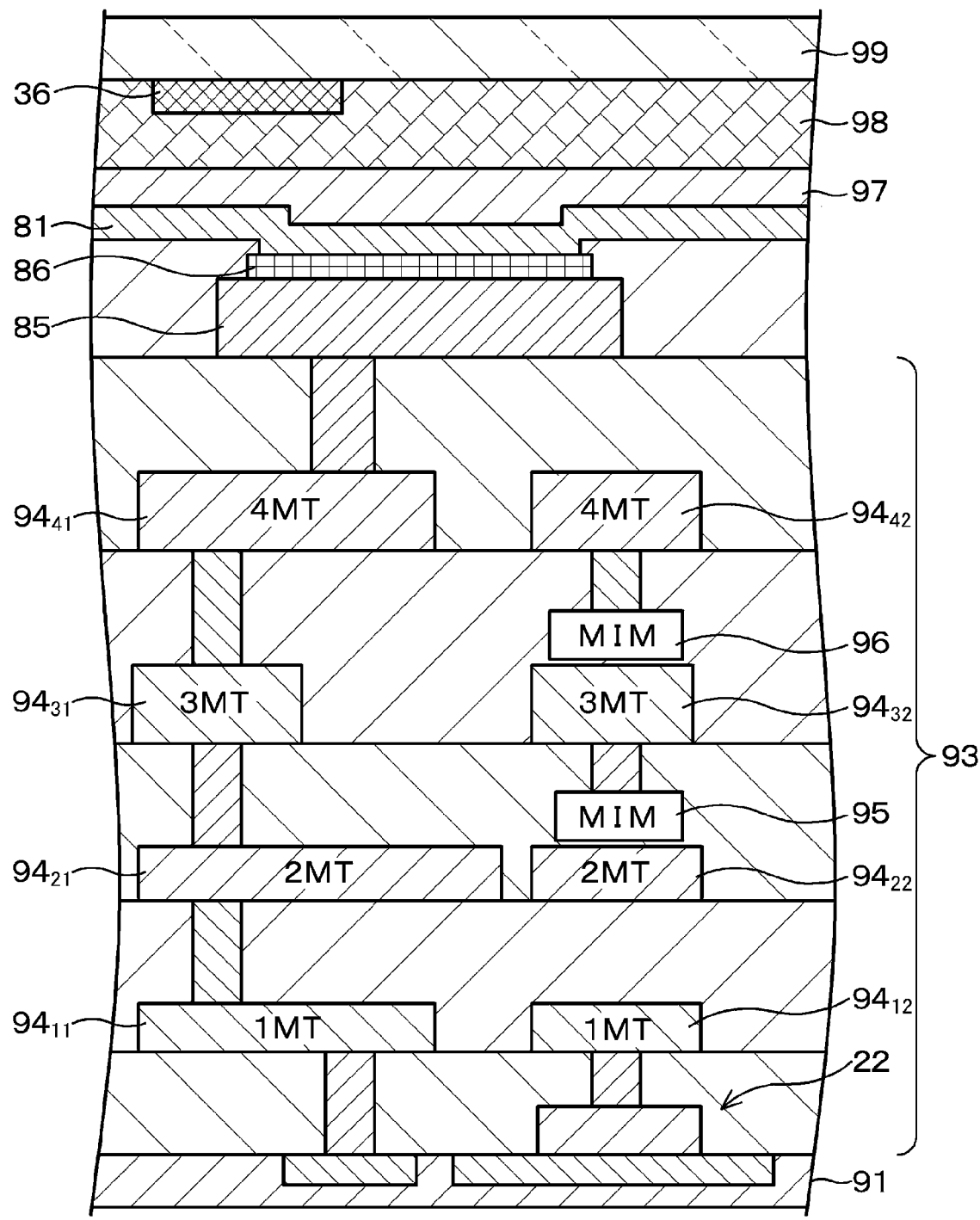
FIG. 12 is a cross-sectional view illustrating a cross-sectional structure of a panel wiring structure according to an eighth embodiment.

The eighth embodiment is a modified example of the second embodiment, and is an example of laying out the pixel portion auxiliary cable 36 on an opposing substrate side. FIG. 12 illustrates a cross-sectional structure of a panel wiring structure according to the eighth embodiment.

Although the illustration of a color filter and an opposing substrate is omitted in the second embodiment (FIG. 6), in an actual panel wiring structure, as illustrated in FIG. 12, a color filter 98 is formed for each pixel on the cathode electrode 81 via a protection layer 97, and an opposing substrate 99 is formed on the color filter 98. The opposing substrate 99 includes a glass substrate or the like, and is provided for protecting the organic EL element 21.

In the panel wiring structure having the above-described configuration, the pixel portion auxiliary cable 36 for reducing interconnection resistance of the cathode cable 35 is formed in a hierarchy on the emission side of the organic EL element 21, specifically, formed in a hierarchy of the color filter 98 on the opposing substrate 99 side. In other words, a hierarchy in which the pixel portion auxiliary cable 36 is laid out is not limited to a hierarchy between a layer on which a circuit unit such as the drive transistor 22 is formed and a layer on which the organic EL element 21 is formed. The pixel portion auxiliary cable 36 is connected to none of the pixels 20. In the case of the present embodiment, a structure in which the semiconductor substrate 91 and the opposing substrate 99 are electrically connected in the region of the frame portion 70A is employed.

Modified Example

Heretofore, the technology of the present disclosure has been described on the basis of preferred embodiments, but the technology of the present disclosure is not limited to the embodiments. The configurations and structures of the display device described in the above-described embodiments are exemplifications, and can be appropriately changed.

For example, in the above-described embodiments, the cathode cable 35 has been exemplified as a fixed potential line being a connection destination of the pixel portion auxiliary cable 36, but the cathode cable 35 is an example, and the fixed potential line is not limited to this. In other words, a connection destination of the pixel portion auxiliary cable 36 is only required to be an electrical cable into which cathode current can be flown and to which a fixed potential is applied. Accordingly, a power source cable of the source voltage $V_{cc}$ can be used as a connection destination of the pixel portion auxiliary cable 36.

Furthermore, in the above-described embodiments, the description has been given of a case where the technology is applied to an organic EL display device, but the application is not limited to the application to an organic EL display device, and the technology can be applied to all display devices including a current path corresponding to the cathode cable 35, in a frame portion of a display panel.

<Electronic Device of Present Disclosure>

The above-described display device of the present disclosure can be used as a display unit (display device) of an electronic device in any field that displays a video signal input to the electronic device or a video signal generated in the electronic device, as an image or a video. As an electronic device, a television set, a mobile terminal device such as a laptop personal computer, a digital still camera, and a mobile phone, a head-mounted display, and the like can be exemplified. Nevertheless, the electronic device is not limited to these.

In this manner, by using the display device of the present disclosure as a display unit of an electronic device in any field, the following effects can be obtained. More specifically, according to the display device of the present disclosure, all of enhancement of pixel resolution, higher luminance, and a narrower frame can be satisfied. Accordingly, the use of the display device of the present disclosure can contribute to higher performance of the display unit of the electronic device and the downsizing of an electronic device main body.

The display device of the present disclosure also includes a display device having a modular shape with a sealed configuration. As an example, a display module formed by attaching an opposing portion such as transparent glass to a pixel array portion corresponds to such a display device. Note that the display module may be provided with a circuit unit or a flexible printed circuit (FPC) for inputting and outputting a signal and the like from the outside to the pixel array portion, and the like. Hereinafter, as specific examples of an electronic device that uses the display device of the present disclosure, a digital still camera and a head-mounted display will be exemplified. Nevertheless, the specific examples exemplified here are mere examples, and the specific examples are not limited to these.

Specific Example 1

Figure 13A:
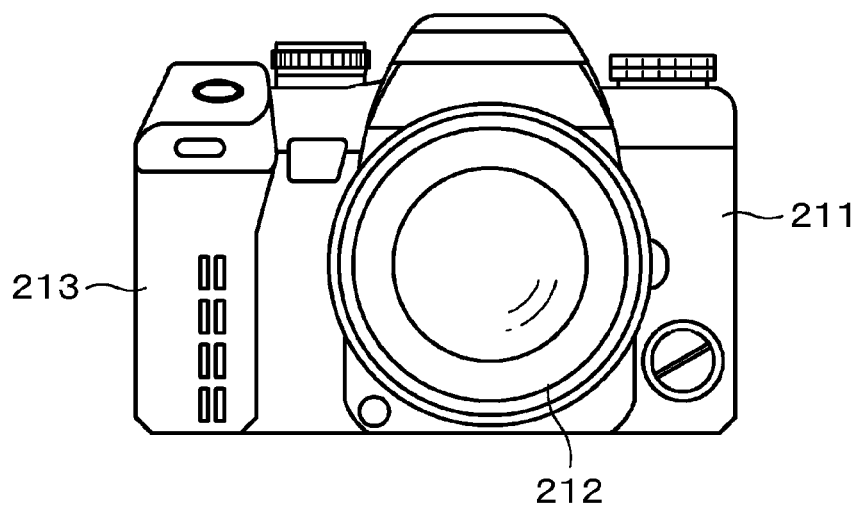
FIG. 13A is a front view of a digital still camera of a lens-interchangeable single-lens reflex type according to Specific Example 1 of an electronic device of the present disclosure.
Figure 13B:
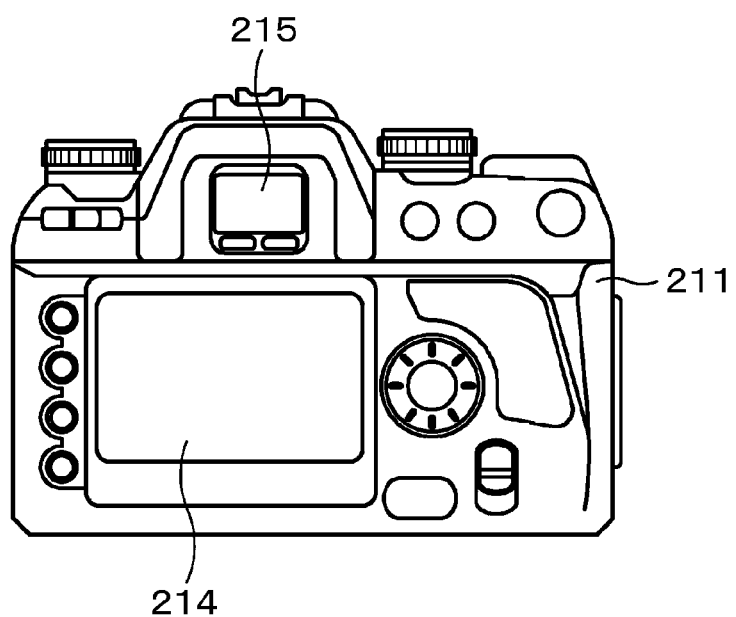
FIG. 13B is a rear view of the digital still camera.

FIG. 13 is an external view of a digital still camera of a lens-interchangeable single-lens reflex type according to Specific Example 1 of the electronic device according to the present disclosure. FIG. 13A illustrates a front view of the digital still camera, and FIG. 13B illustrates a rear view of the digital still camera.

The digital still camera of the lens-interchangeable single-lens reflex type according to this Specific Example 1 includes, for example, an interchangeable imaging lens unit (interchangeable lens) 212 on the front surface right side of a camera main body portion (camera body) 211, and a grip portion 213 to be gripped by a photographer, on the front surface left side.

Then, a monitor 214 is provided at the substantially center of the back surface of the camera main body portion 211. An electronic viewfinder (eyepiece window) 215 is provided above the monitor 214. By looking into the electronic viewfinder 215, the photographer can visually recognize an optical image of a subject that has been guided from the imaging lens unit 212, and decide a composition.

In the digital still camera of the lens-interchangeable single-lens reflex type having the above-described configuration, the display device of the present disclosure can be used as the electronic viewfinder 215. In other words, the digital still camera of the lens-interchangeable single-lens reflex type according to this Specific Example 1 can be manufactured using the display device of the present disclosure as the electronic viewfinder 215.

Specific Example 2

Figure 14:
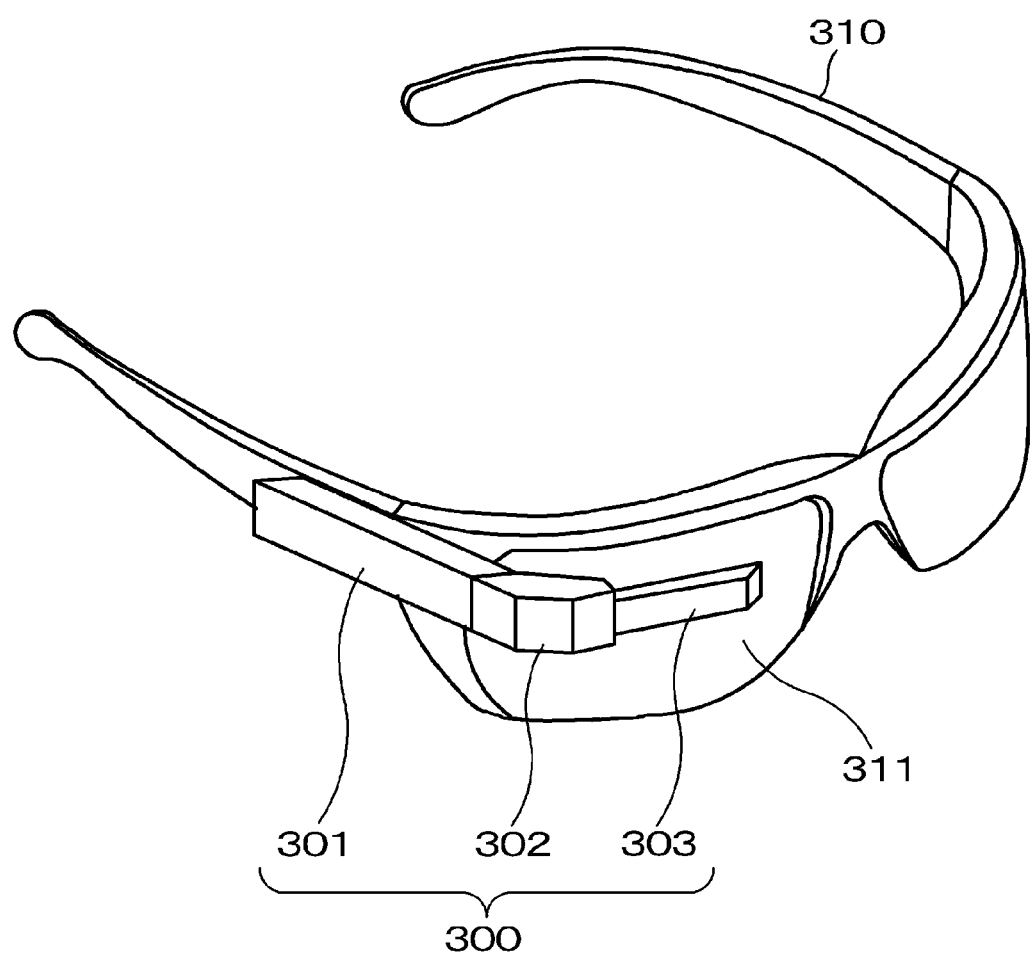
FIG. 14 is an external view illustrating an example of a head-mounted display according to Specific Example 2 of an electronic device of the present disclosure.

FIG. 14 is an external view illustrating an example of a head-mounted display according to Specific Example 2 of an electronic device of the present disclosure.

A head-mounted display 300 according to this Specific Example 2 has a transmissive type head-mounted display configuration including a main body portion 301, an arm portion 302, and a lens barrel 303. The main body portion 301 is connected with the arm portion 302 and glasses 310. Specifically, an end portion in a long side direction of the main body portion 301 is attached to the arm portion 302. Furthermore, one side of a side surface of the main body portion 301 is coupled to the glasses 310 via a connection member (not illustrated). Note that the main body portion 301 may be directly attached to a head portion of a human body.

The main body portion 301 incorporates a control board and a display unit for controlling an operation of the head-mounted display 300. The arm portion 302 supports the lens barrel 303 with respect to the main body portion 301 by coupling the main body portion 301 and the lens barrel 303. Specifically, the arm portion 302 fixes the lens barrel 303 to the main body portion 301 by bonding an end portion of the main body portion 301 and an end portion of the lens barrel 303. Furthermore, the arm portion 302 incorporates a signal line for communicating data regarding an image provided from the main body portion 301 to the lens barrel 303.

The lens barrel 303 projects image light provided from the main body portion 301 through the arm portion 302, toward eyes of a user wearing the head-mounted display 300, through lenses 311 of the glasses 310.

In the head-mounted display 300 having the above-described configuration, the display device of the present disclosure can be used as the display unit incorporated in the main body portion 301. In other words, the head-mounted display 300 according to this Specific Example 2 can be manufactured using the display device of the present disclosure as the display unit.

<Configuration that can be Employed in Present Disclosure>

Note that the present disclosure can employ the following configurations.

«A. Display Device»

[A-1] A Display Device Including:

a pixel array portion including arrayed pixels including a light emission unit; and a fixed potential line provided around the pixel array portion, in which a pixel portion auxiliary cable electrically connected to the fixed potential line is provided in the pixel array portion.

[A-2] The display device according to [A-1] described above,
in which the fixed potential line is a cathode cable configured to apply a fixed potential to a cathode electrode of the light emission unit.
[A-3] The display device according to [A-2] described above,
in which the cathode cable is provided in a frame portion to surround the pixel array portion.
[A-4] The display device according to any of [A-1] to [A-3] described above,
in which the pixel portion auxiliary cable is linearly formed along a column direction or a row direction of a matrix-shaped pixel array of the pixel array portion, or the column direction and the row direction.
[A-5] The display device according to [A-4] described above,
in which the pixel portion auxiliary cable is formed in a hierarchy between a layer on which a circuit unit that drives the light emission unit is formed, and a layer on which the light emission unit is formed.
[A-6] The display device according to [A-4] described above,
in which the pixel portion auxiliary cable is formed in a hierarchy on an emission side of the light emission unit.
[A-7] The display device according to [A-5] or [A-6] described above,
in which the circuit unit that drives the light emission unit is formed on a semiconductor substrate.
[A-8] The display device according to [A-4] described above,
in which the pixel portion auxiliary cable is formed in a hierarchy inferior to the layer on which the circuit unit that drives the light emission unit is formed.
[A-9] The display device according to [A-8] described above,
in which the circuit unit that drives the light emission unit is formed on an insulative transparent substrate.
[A-10] The display device according to any of [A-1] to [A-9] described above,
in which the light emission unit includes an organic electroluminescent element.
«B. Electronic Device»
[B-1] An electronic device including a display device including:
a pixel array portion including arrayed pixels including a light emission unit; and
a fixed potential line provided around the pixel array portion,
in which a pixel portion auxiliary cable electrically connected to the fixed potential line is provided in the pixel array portion.
[B-2] The electronic device according to [B-1] described above,
in which the fixed potential line is a cathode cable configured to apply a fixed potential to a cathode electrode of the light emission unit.
[B-3] The electronic device according to [B-2] described above,
in which the cathode cable is provided in a frame portion to surround the pixel array portion.
[B-4] The electronic device according to any of [B-1] to [B-3] described above,
in which the pixel portion auxiliary cable is linearly formed along a column direction or a row direction of a matrix-shaped pixel array of the pixel array portion, or the column direction and the row direction.

[B-5] The electronic device according to [B-4] described above,
in which the pixel portion auxiliary cable is formed in a hierarchy between a layer on which a circuit unit that drives the light emission unit is formed, and a layer on which the light emission unit is formed.
[B-6] The electronic device according to [B-4] described above,
in which the pixel portion auxiliary cable is formed in a hierarchy on an emission side of the light emission unit.
[B-7] The electronic device according to [B-5] or [B-6] described above,
in which the circuit unit that drives the light emission unit is formed on a semiconductor substrate.
[B-8] The electronic device according to [B-4] described above,
in which the pixel portion auxiliary cable is formed in a hierarchy inferior to the layer on which the circuit unit that drives the light emission unit is formed.
[B-9] The electronic device according to [B-8] described above,
in which the circuit unit that drives the light emission unit is formed on an insulative transparent substrate.
[B-10] The electronic device according to any of [B-1] to [B-9] described above,
in which the light emission unit includes an organic electroluminescent element.

REFERENCE SIGNS LIST

10 Organic EL display device
20 Pixel
21 Organic EL element
22 Drive transistor
23 Writing transistor (sampling transistor)
24 Light emission control transistor
25 Switching transistor
26 Holding capacitance
27 Auxiliary capacitance
30 Pixel array portion
31($31_1$ to $31_m$) Scanning line
32($32_1$ to $32_m$) First drive line
33($33_1$ to $33_m$) Second drive line
34($34_1$ to $34_n$) Signal line
35 Cathode cable
36 Pixel portion auxiliary cable
40 Writing scanning unit
50 Drive scanning unit
60 Signal output unit
70 Display panel
70A Frame portion
81 Cathode electrode
82 Flexible printed circuit board
83 Frame portion auxiliary cable
84 Relay cable
85 Anode electrode
86 Organic EL layer

The invention claimed is:
1. A display device comprising:
a pixel array portion including pixels arrayed in a matrix having a row direction and a column direction, the pixels each respectively including a light emission unit;
a cathode cable surrounding the pixel array portion in a frame portion outside the pixel array portion;
a pixel portion auxiliary cable arranged to extend across the pixel array portion in a horizontal direction in a cross-section perspective, the pixel portion auxiliary cable being interlayer connected to the cathode cable through an interlayer wiring that extends in a vertical direction in the cross-section perspective, the interlayer wiring being located in the frame portion outside the pixel array portion; and a frame portion auxiliary cable arranged in the frame portion outside the pixel array portion, the frame portion auxiliary cable being connected to the cathode cable through another interlayer wiring, at a location different from the location of the interlayer wiring in the cross-section perspective.

2. The display device according to claim 1,
wherein the cathode cable is configured to apply a fixed potential to a cathode electrode of the light emission unit.

3. The display device according to claim 1,
wherein the pixel portion auxiliary cable extends across the pixel array portion in the column direction or the row direction.

4. The display device according to claim 3, wherein the pixel portion auxiliary cable is formed in a hierarchy between a layer on which a circuit unit that drives the light emission unit is formed, and a layer on which the light emission unit is formed.

5. The display device according to claim 4,
wherein the circuit unit that drives the light emission unit is formed on a semiconductor substrate.

6. The display device according to claim 3,
wherein the pixel portion auxiliary cable is formed in a hierarchy on an emission side of the light emission unit.

7. The display device according to claim 3,
wherein the pixel portion auxiliary cable is formed in a hierarchy inferior to the layer on which the circuit unit that drives the light emission unit is formed.

8. The display device according to claim 7,
wherein the circuit unit that drives the light emission unit is formed on an insulative transparent substrate.

9. The display device according to claim 1,
wherein the light emission unit includes an organic electroluminescent element.

10. The display device according to claim 1, wherein the pixel portion auxiliary cable is directly interlayer connected to the cathode cable at respective locations in the frame portion outside the pixel array portion through the interlayer wiring and another interlayer wiring respectively located along opposing sides of the pixel array portion.

11. The display device according to claim 1, wherein the cathode cable includes a same metal material as an anode electrode of the light emission unit.

12. The display device according to claim 11, wherein a first interconnection resistance of the frame portion auxiliary cable is lower than a second interconnection resistance of the cathode cable.

13. The display device according to claim 1, wherein a first interconnection resistance of the frame portion auxiliary cable is lower than a second interconnection resistance of the cathode cable.

14. An electronic device including a display device comprising:

a pixel array portion including pixels arrayed in a matrix having a row direction and a column direction, the pixels each respectively including a light emission unit;

a cathode cable surrounding the pixel array portion in a frame portion outside the pixel array portion;

a pixel portion auxiliary cable arranged to extend across the pixel array portion in a horizontal direction in a cross-section perspective, the pixel portion auxiliary cable being interlayer connected to the cathode cable through an interlayer wiring that extends in a vertical direction in the cross-section perspective, the interlayer wiring being located in the frame portion outside the pixel array portion; and a frame portion auxiliary cable arranged in the frame portion outside the pixel array portion, the frame portion auxiliary cable being connected to the cathode cable through another interlayer wiring, at a location different from the location of the interlayer wiring in the cross-section perspective.

15. The electronic device according to claim 14,
wherein the cathode cable is configured to apply a fixed potential to a cathode electrode of the light emission unit.

16. The electronic device according to claim 14,
wherein the pixel portion auxiliary cable extends across the pixel array portion in the column direction or the row direction.

17. The electronic device according to claim 16, wherein the pixel portion auxiliary cable is formed in a hierarchy between a layer on which a circuit unit that drives the light emission unit is formed, and a layer on which the light emission unit is formed.

18. The electronic device according to claim 17,
wherein the circuit unit that drives the light emission unit is formed on a semiconductor substrate.

19. The electronic device according to claim 16,
wherein the pixel portion auxiliary cable is formed in a hierarchy on an emission side of the light emission unit.

20. The electronic device according to claim 16,
wherein the pixel portion auxiliary cable is formed in a hierarchy inferior to the layer on which the circuit unit that drives the light emission unit is formed.

21. The electronic device according to claim 20,
wherein the circuit unit that drives the light emission unit is formed on an insulative transparent substrate.

22. The electronic device according to claim 14,
wherein the light emission unit includes an organic electroluminescent element.

23. The electronic device according to claim 14, wherein the pixel portion auxiliary cable is directly interlayer connected to the cathode cable at respective locations in the frame portion outside the pixel array portion through the interlayer wiring and another interlayer wiring respectively located along opposing sides of the pixel array portion.

24. The electronic device according to claim 14, wherein the cathode cable includes a same metal material as an anode electrode of the light emission unit.

25. The electronic device according to claim 24, wherein a first interconnection resistance of the frame portion auxiliary cable is lower than a second interconnection resistance of the cathode cable.

26. The electronic device according to claim 14, wherein a first interconnection resistance of the frame portion auxiliary cable is lower than a second interconnection resistance of the cathode cable.

* * * * *